United States Patent
Fujishima et al.

(10) Patent No.: US 12,044,839 B2
(45) Date of Patent: Jul. 23, 2024

(54) LIGHT DEFLECTOR, DEFLECTING DEVICE, DISTANCE-MEASURING APPARATUS, IMAGE PROJECTION DEVICE, AND VEHICLE

(71) Applicant: RICOH COMPANY, LTD., Tokyo (JP)

(72) Inventors: Masayuki Fujishima, Kanagawa (JP); Nobunari Tsukamoto, Osaka (JP)

(73) Assignee: RICOH COMPANY, LTD., Tokyo (JP)

(*) Notice: Subject to any disclaimer, the term of this patent is extended or adjusted under 35 U.S.C. 154(b) by 347 days.

(21) Appl. No.: 17/034,213

(22) Filed: Sep. 28, 2020

(65) Prior Publication Data

US 2021/0109342 A1    Apr. 15, 2021

(30) Foreign Application Priority Data

Oct. 11, 2019   (JP) .................................. 2019-188144

(51) Int. Cl.
  *G02B 26/08*       (2006.01)
  *G01S 17/08*       (2006.01)
  (Continued)

(52) U.S. Cl.
  CPC .......... *G02B 26/0858* (2013.01); *G01S 17/08* (2013.01); *G02B 27/0172* (2013.01); *H02N 2/0085* (2013.01); *G02B 2027/0154* (2013.01)

(58) Field of Classification Search
  CPC .............. G02B 26/0858; G02B 26/105; G02B 26/101; G02B 26/0833; G02B 26/10
  See application file for complete search history.

(56) References Cited

U.S. PATENT DOCUMENTS 9,030,721 B2 * 5/2015 Naono .................... G02B 26/10
                                                       359/200.1
9,678,335 B2 * 6/2017 Naono ............... G02B 26/0858
(Continued)

FOREIGN PATENT DOCUMENTS

CN          101876778 A  * 11/2010    ......... G02B 26/0833
CN          104345365 A  *  2/2015    ........... G02B 26/001
(Continued)

OTHER PUBLICATIONS

Extended European Search Report issued Mar. 5, 2021 in European Patent Application No. 20200684.7, 8 pages.
(Continued)

*Primary Examiner* — Christopher Stanford
(74) *Attorney, Agent, or Firm* — XSENSUS LLP

(57) ABSTRACT

A light deflector includes a reflector having a reflecting surface; a first movable unit having one end coupled to the reflector; a second movable unit having one end coupled to the reflector, the reflector disposed between the first movable unit and the second movable unit; a first piezoelectric element on the first movable unit; a second piezoelectric element on the second movable unit; a first supporting part coupled to the other end of the first movable unit; a second supporting part coupled to the other end of the second movable unit; an input part configured to receive voltage to be applied to at least the second piezoelectric element; and a wire electrically connecting the second piezoelectric element and the input part through the reflector configured to transmit the voltage to the second piezoelectric element. A passage area is provided through which light reflected by the reflector passes.

20 Claims, 23 Drawing Sheets

(51) Int. Cl.
*G02B 27/01* (2006.01)
*H02N 2/00* (2006.01)

(56) References Cited

U.S. PATENT DOCUMENTS

| | | | |
|---|---|---|---|
| 9,759,993 B2 | 9/2017 | Desai | |
| 9,817,230 B2* | 11/2017 | Yamada | G02B 26/0858 |
| 9,864,189 B2* | 1/2018 | Naono | H01L 41/1876 |
| 9,910,271 B2* | 3/2018 | Kitazawa | G02B 27/286 |
| 9,946,063 B2* | 4/2018 | Hibiya | G02B 26/105 |
| 2002/0044327 A1* | 4/2002 | Fujita | G02B 26/10 359/224.1 |
| 2004/0100680 A1 | 5/2004 | Huibers et al. | |
| 2008/0158631 A1 | 7/2008 | Davis et al. | |
| 2011/0032590 A1 | 2/2011 | Terada et al. | |
| 2012/0160557 A1* | 6/2012 | Yamada | G02B 26/0858 174/544 |
| 2012/0250130 A1 | 10/2012 | Naono | |
| 2013/0083378 A1* | 4/2013 | Tanaka | G01B 11/25 359/199.4 |
| 2017/0269352 A1 | 9/2017 | Hashiguchi et al. | |
| 2017/0350759 A1 | 12/2017 | Azumi et al. | |
| 2017/0374325 A1 | 12/2017 | Itoh et al. | |
| 2018/0215608 A1 | 8/2018 | Fujishima et al. | |
| 2018/0252578 A1 | 9/2018 | Suzuki et al. | |
| 2018/0267293 A1 | 9/2018 | Fujishima et al. | |
| 2019/0196178 A1* | 6/2019 | Yamada | G02B 26/10 |
| 2021/0041687 A1 | 2/2021 | Yokota et al. | |
| 2021/0109342 A1* | 4/2021 | Fujishima | H01L 41/0475 |
| 2022/0137398 A1* | 5/2022 | Seto | G01S 17/08 356/4.01 |

FOREIGN PATENT DOCUMENTS

| | | | | |
|---|---|---|---|---|
| CN | 104520795 A | * | 4/2015 | G06F 3/0421 |
| CN | 105549201 A | * | 5/2016 | G02B 26/0858 |
| CN | 105549201 B | * | 7/2019 | G02B 26/0858 |
| CN | 109975974 A | * | 7/2019 | G02B 26/0858 |
| CN | 107870416 B | * | 2/2022 | G02B 26/0858 |
| CN | 109946828 B | * | 4/2022 | G02B 26/0858 |
| EP | 3 220 183 B1 | | 11/2021 | |
| JP | 2000-214407 | | 8/2000 | |
| JP | 2000214407 A | * | 8/2000 | G02B 26/0841 |
| JP | 2005198193 A | * | 7/2005 | |
| JP | 2010026192 A | * | 2/2010 | G02B 26/0833 |
| JP | 2010286589 A | * | 12/2010 | |
| JP | 2011186124 A | * | 9/2011 | |
| JP | 2013092750 A | * | 5/2013 | G01B 11/25 |
| JP | 2013541037 A | * | 11/2013 | |
| JP | 2016099567 A | * | 5/2016 | |
| JP | 2017-173803 A | | 9/2017 | |
| JP | 2020-101587 | | 7/2020 | |
| KR | 20140109398 A | * | 9/2014 | |
| WO | 2009/130902 A1 | | 10/2009 | |
| WO | 2013/187003 A1 | | 12/2013 | |

OTHER PUBLICATIONS

Intention to grant issued Jun. 12, 2023 in European Patent Application No. 20 200 684.7, 68 pages. (with Text intended for grant).
Japanese Office Action issued Jun. 6, 2023, in corresponding Japanese Patent Application No. 2019-188144, 8pp.

* cited by examiner

US 12,044,839 B2

LIGHT DEFLECTOR, DEFLECTING DEVICE, DISTANCE-MEASURING APPARATUS, IMAGE PROJECTION DEVICE, AND VEHICLE

CROSS-REFERENCE TO RELATED APPLICATIONS

This patent application is based on and claims priority pursuant to 35 U.S.C. § 119(a) to Japanese Patent Application No. 2019-188144, filed on Oct. 11, 2019, in the Japan Patent Office, the entire disclosure of which is hereby incorporated by reference herein.

BACKGROUND

Technical Field

Embodiments of the present disclosure relate to a light deflector, a deflecting device, a distance-measuring apparatus, an image projection device, and a vehicle.

Related Art

In recent years, with the development of micromachining technology applying semiconductor manufacturing technology, development of micro electro mechanical systems (MEMS) devices manufactured by micromachining silicon or glass is advancing.

As a MEMS device, there is known a light deflector that includes a drive beam including an elastic beam and a movable device including a reflecting surface, which are combined as a single unit on a wafer, the drive beam also including a thin film of a piezoelectric material superposed on the elastic beam, and that causes the movable device to oscillate using the drive beam.

SUMMARY

In one aspect of this disclosure, there is described a light deflector comprising:
a reflector having a reflecting surface; a first movable unit having one end coupled to the reflector; a second movable unit having one end coupled to the reflector, the reflector disposed between the first movable unit and the second movable unit; a first piezoelectric element disposed on the first movable unit, the first piezoelectric element configured to deform the first movable unit; a second piezoelectric element disposed on the second movable unit, the second piezoelectric element configured to deform the second movable unit; a first supporting part coupled to the other end of the first movable unit; a second supporting part coupled to the other end of the second movable unit; an input part disposed on the first supporting part, the input part configured to receive a voltage to be applied to at least the second piezoelectric element; and a wire electrically connecting the second piezoelectric element and the input part through the reflector, the wire configured to transmit the voltage received by the input part, to the second piezoelectric element. A passage area is provided through which light reflected by the reflector passes.

In another aspect of this disclosure, there is a deflecting device including a light source and the light deflector.

In still another aspect of this disclosure, there is a distance-measuring apparatus including the light deflector.

In yet another aspect of this disclosure, there is an image projection device including the light deflector.

Further described is a vehicle including at least one of the distance-measuring apparatus and the image projection device.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
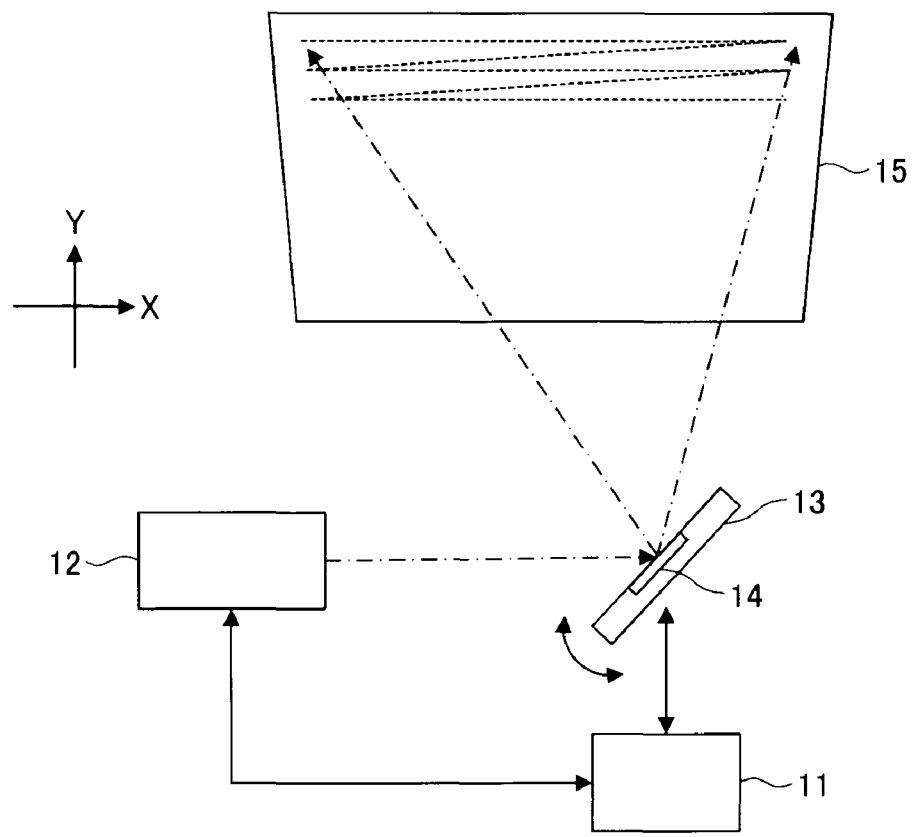
FIG. 1 is a schematic view of an optical scanning system according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

A light deflector that provides scanning with light reflected by a reflecting surface by the oscillation of a movable device is disclosed. The movable device includes a supporting unit provided with an opening.

However, the light deflector further includes an electrode connecting part (an electrode pad) at each of the facing supporting units, each electrode connecting part configured to receive voltage signals and conduct electricity to a piezoelectric drive circuit. This adversely reduces the degree of flexibility in arrangement of the components in the light deflector, which further complicates the configuration of the light deflector.

The embodiments of the present disclosure improve the degree of flexibility in layout of the components in the light deflector.

An optical scanning system 10 to which a movable device 13 according to an embodiment is applied is described in detail with reference to FIGS. 1 to 4.

FIG. 1 is a schematic view of an optical scanning system according to an embodiment of the present disclosure. As illustrated in FIG. 1, the optical scanning system 10 deflects light emitted from a light-source device 12 under the control of a control device 11, by using a reflecting surface 14 included in the movable device 13, so as to optically scan a target surface 15 to be scanned (hereinafter, referred to as target surface).

The optical scanning system 10 includes the control device 11, the light-source device 12, and the movable device 13 having the reflecting surface 14. The movable device 13 is an example of a light deflector.

The control device 11 is, for example, an electronic circuit unit including, for example, a central processing unit (CPU) and a field-programmable gate array (FPGA). The movable device 13 is provided with the reflecting surface 14 and serves as a micro electro mechanical systems (MEMS) device that can move the reflecting surface 14. The light-source device 12 is, for example, a laser device that emits a laser beam. The target surface 15 is, for example, a screen.

The control device 11 generates control instructions for the light-source device 12 and the movable device 13 based on the optical scanning information obtained from an external device, and outputs drive signals to the light-source device 12 and the movable device 13 in accordance with the generated control instructions.

The light-source device 12 controls a light source in accordance with the received drive signal. The movable device 13 moves the reflecting surface 14 in at least one of a uniaxial direction and a biaxial direction, in accordance with the received drive signal.

With this configuration, for example, the reflecting surface 14 of the movable device 13 is biaxially moved in a reciprocating manner within a predetermined range, and the light emitted from the light-source device 12 to be incident on the reflecting surface 14 is deflected around a prescribed single axis to perform optical scanning, under the control of the control device 11, which is based on image data that is an example of the optical-scanning information. Thus, an image can be projected onto the target surface 15 as desired. The details of the movable device and the details of the control of the control device according to the embodiment are described later.

Figure 2:
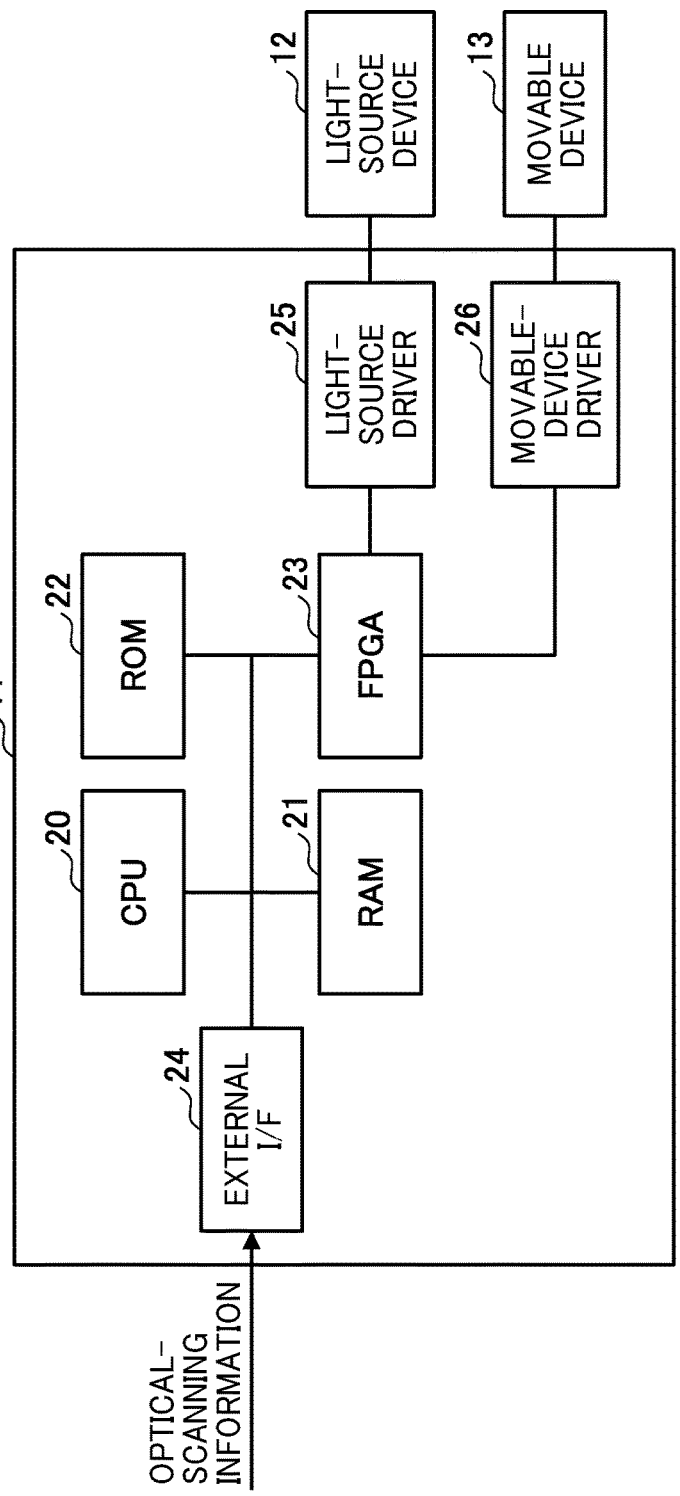
FIG. 2 is a hardware block diagram of the optical scanning system according to an embodiment of the present disclosure.

Next, the hardware configuration of an example of the optical scanning system 10 is described with reference to FIG. 2. FIG. 2 is a hardware block diagram of the optical scanning system 10 according to an embodiment of the present disclosure. As illustrated in FIG. 2, the optical scanning system 10 includes the control device 11, the light-source device 12, and the movable device 13, which are electrically connected to one another. The control device 11 includes a CPU 20, a random access memory (RAM) 21, a read only memory (ROM) 22, a FPGA 23, an external interface (I/F) 24, a light-source driver 25, and a movable-device driver 26.

The CPU 20 is an arithmetic device that loads into the RAM 21 a program or data from a storage device such as the ROM 22 and executes processing to provide the controls or functions of the entirety of the control device 11.

The RAM 21 is a volatile storage device that temporarily stores a program and data.

The ROM 22 is a non-volatile storage device that stores a program and data even after the power is turned off, and stores a program and data for processing that is executed by the CPU 20 to control each function of the optical scanning system 10.

The FPGA 23 is a circuit that outputs proper control signals to the light-source driver 25 and the movable-device driver 26 in accordance with the processing performed by the CPU 20.

The external I/F 24 is an interface with an external device or a network. The external device may be, for example, a host device such as a personal computer (PC); or a storage device, such as a universal serial bus (USB) memory, a secure digital (SD) card, a compact disk (CD), a digital versatile disk (DVD), a hard disk drive (HDD), or a solid state drive (SSD). The network may be a controller area network (CAN) of an automobile, a local area network (LAN), or the Internet. The external I/F 24 may have any configuration that achieves connection to an external device or communication with an external device. The external I/F 24 may be prepared for each external device.

The light-source driver 25 is an electric circuit that outputs a drive signal such as a drive voltage to the light-source device 12 in accordance with the received control signal.

The movable-device driver 26 is an electric circuit that outputs a drive signal such as a drive voltage to the movable device 13 in accordance with the received control signal.

In the control device 11, the CPU 20 acquires optical-scanning information from an external device or a network through the external I/F 24. As far as the CPU 20 can acquire the optical-scanning information, the optical-scanning information may be stored in the ROM 22 or the FPGA 23 in the control device 11. Alternatively, a storage device such as a SSD may be additionally provided in the control device 11 and the optical-scanning information may be stored in the storage device.

In this case, the optical-scanning information is information indicating the way of optical scanning to be performed on the target surface 15. The optical-scanning information is image data when an image is displayed by optical scanning. For another example, the optical-scanning information is writing data indicating the order and portion of writing when optical writing is performed by optical scanning. For further example, the optical-scanning information is irradiation data indicating the timing and range of irradiation with light for distance measurement when distance measurement is performed by optical scanning.

The control device 11 according to the present embodiment implements the functional configuration described below by using commands from the CPU 20 and the hardware configuration illustrated in FIG. 2.

Figure 3:
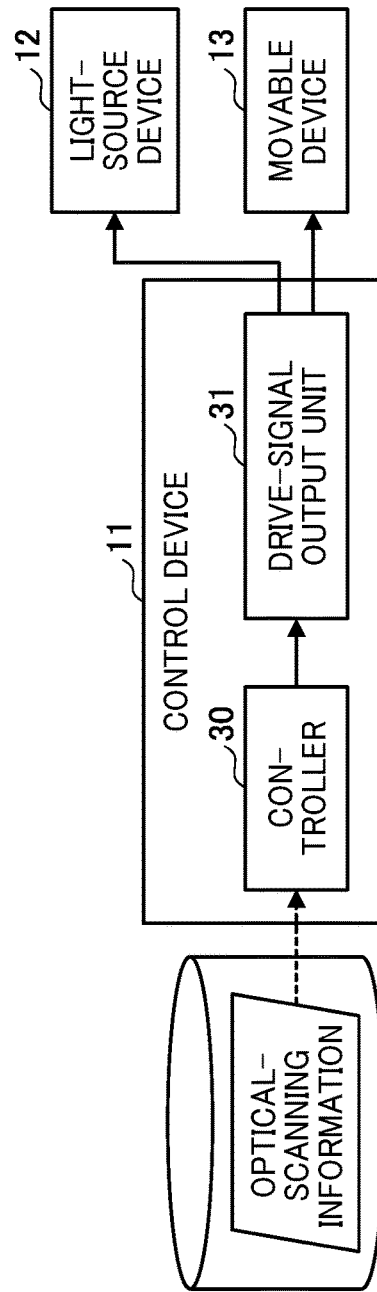
FIG. 3 is a functional block diagram of a control device according to an embodiment of the present disclosure.

Next, the functional configuration of the control device 11 of the optical scanning system 10 is described below referring to FIG. 3. FIG. 3 is a functional block diagram of the control device 11 of the optical scanning system 10, according to an embodiment of the present disclosure.

As illustrated in FIG. 3, the controller 11 has the functions of a controller 30 and a drive-signal output unit 31.

The controller 30 is implemented by, for example, the CPU 20 and the FPGA 23. The controller 30 acquires optical-scanning information from an external device, converts the optical-scanning information into a control signal, and outputs the control signal to the drive-signal output unit 31. More specifically, the controller 30 acquires image data serving as the optical-scanning information from an external device or the like, generates a control signal from the image data through predetermined processing, and outputs the control signal to the drive-signal output unit 31.

The drive-signal output unit 31 is implemented by, for example, the light-source driver 25 and the movable-device driver 26. The drive-signal output unit 31 outputs a drive signal to the light-source device 12 or the movable device 13 based on the received control signal.

The drive signal is a signal for controlling the driving of the light-source device 12 or the movable device 13. The driving signal in the light-source device 12 is a driving voltage used to control the timing at which light is emitted and the irradiation intensity. Moreover, for example, the drive signal in the movable device 13 is a drive voltage used to control the timing and range of motion where the reflecting surface 14 of the movable device 13 is moved.

Figure 4:
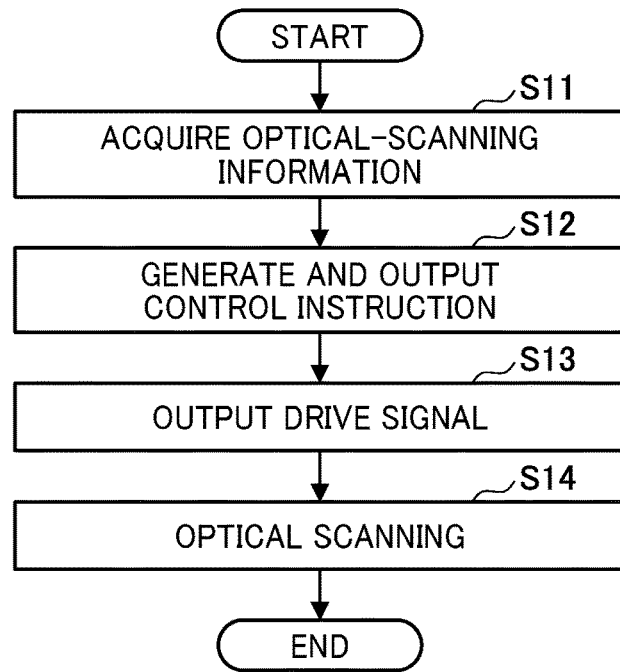
FIG. 4 is a flowchart of processing relating to the optical scanning system, according to an embodiment of the present disclosure.

Next, the process of optically scanning the target surface 15 performed by the optical scanning system 10 is described referring to FIG. 4. FIG. 4 is a flowchart of an example of processing performed by the optical scanning system 10.

In step S11, the controller 30 acquires optical-scanning information from, for example, an external device.

In step S12, the controller 30 generates control signals (control instruction) from the acquired optical-scanning information, and outputs the control signals to the drive-signal output unit 31.

In step S13, the drive-signal output unit 31 outputs drive signals to the light-source device 12 and the movable device 13 based on the received control signals.

In step S14, the light-source device 12 emits light based on the received drive signal. Further, the movable device 13 moves the reflecting surface 14 based on the input drive signal. The driving of the light-source device 12 and the movable device 13 causes light to be deflected in a given direction, and optical scanning is performed.

In the above-described optical scanning system 10, a single control device 11 has a device and a function for controlling the light-source device 12 and the movable device 13. However, a control device for the light-source device and a control device for the movable device may be separate elements.

In the above-described optical scanning system 10, a single control device 11 has the functions of the controller 30 and the functions of the drive-signal output unit 31 for the light-source device 12 and the movable device 13. These functions may be implemented by separate elements. For example, a drive-signal output device including a drive-signal output unit 31 may be provided in addition to the control device 11 including the controller 30. An optical deflection system that performs optical deflection may be configured by the control device 11 and the movable device 13 provided with the reflecting surface 14, which are elements of the above optical scanning system 10.

An image projection apparatus provided with the movable device according to the embodiment is described below in detail with reference to FIGS. 5 and 6.

Figure 5:
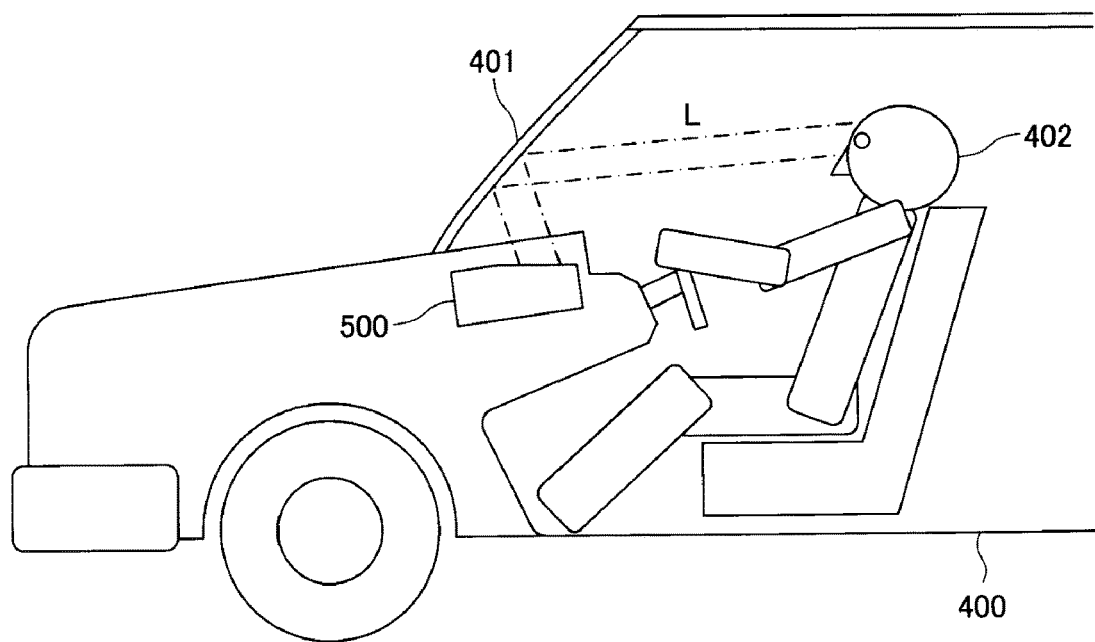
FIG. 5 is a schematic view of a vehicle equipped with a head-up display device (HUD) according to an embodiment of the present disclosure.

FIG. 5 is an illustration of a vehicle 400 provided with a heads-up display 500 that serves as a deflection device and also as an image projection apparatus, according to embodiments of the present disclosure. FIG. 6 is a schematic view of an example of the HUD 500. The image projector projects an image by performing optically scanning.

As illustrated in FIG. 5, for example, the HUD 500 is disposed, for example, near a windshield 401 of the vehicle 400 that serves as a vehicle. Projection light L that is emitted from the HUD 500 is reflected by the windshield 401 and directed to an observer (a driver 402) as a user. Accordingly, the driver 402 can visually recognize as a virtual image an image or the like projected by the HUD 500. Alternatively, a combiner may be disposed on the inner wall surface of the windshield 401 so that the user can visually recognize a virtual image formed by the projection light that is reflected by the combiner.

Figure 6:
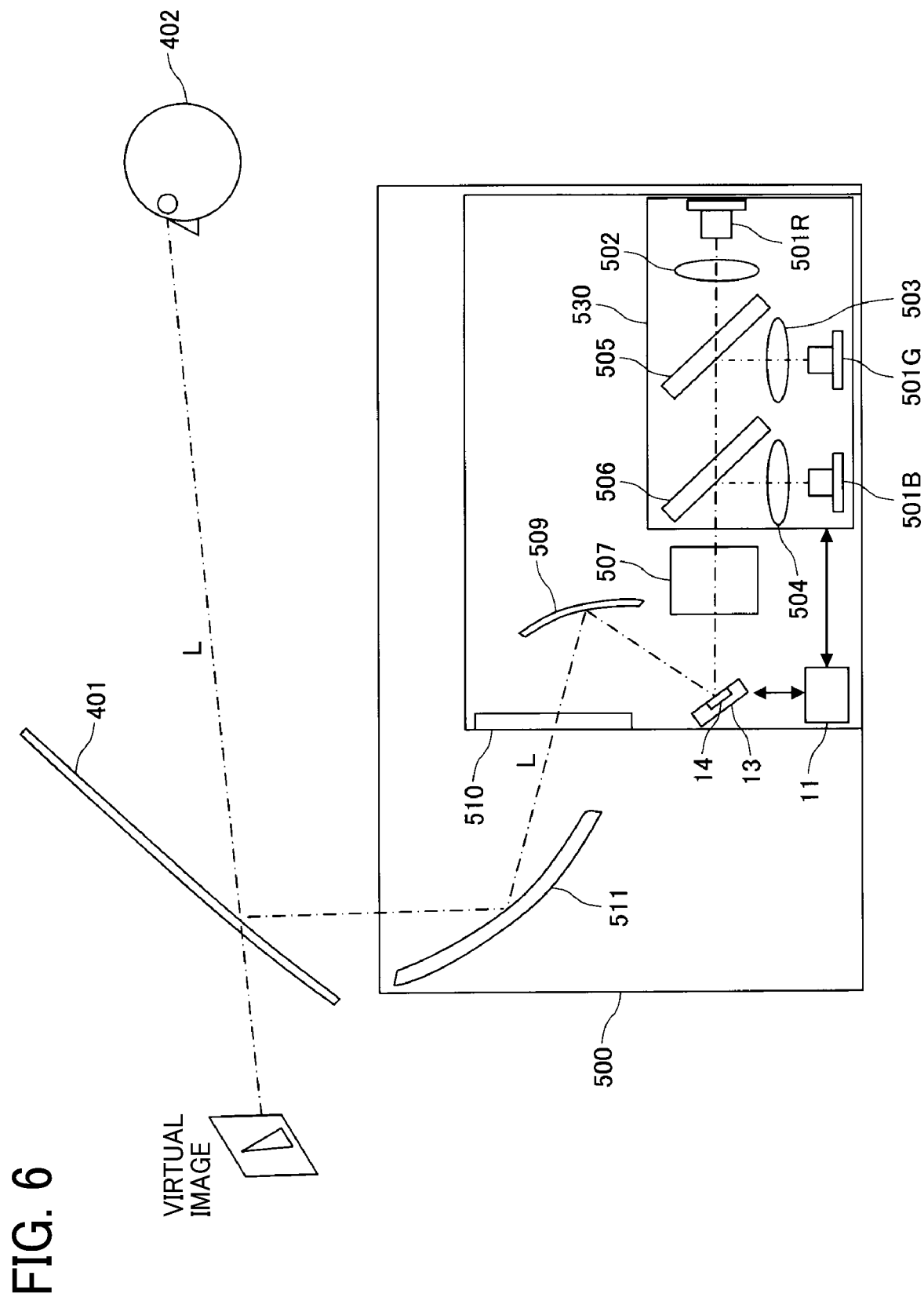
FIG. 6 is a schematic view of an example of the HUD.

As illustrated in FIG. 6, the HUD 500 emits laser beams from red, green, and blue laser-beam sources 501R, 501G, and 501B, respectively. The emitted laser beams pass through an incident optical system, and then are deflected by the movable device 13 including the reflecting surface 14. The incident optical system includes collimator lenses 502, 503, and 504 respectively provided for the laser-beam sources 501R, 501G, and 501B, two dichroic mirrors 505 and 506, and a light-intensity adjuster 507. The deflected laser beams pass through a projection optical system and are projected onto a screen. The projection optical system includes a free-form surface mirror 509, an intermediate screen 510, and a projection mirror 511. In the HUD 500, the laser-beam sources 501R, 501G, 501B, the collimator lenses 502, 503, 504, and the dichroic mirrors 505, 506 are combined as a single unit that is an optical housing serving as a light source unit 530.

The HUD 500 projects an intermediate image displayed on the intermediate screen 510 onto the windshield 401 of the vehicle 400 to allow the driver 402 to visually recognize the intermediate image as a virtual image.

The laser beams of RGB colors emitted from the laser-beam sources 501R, 501G, and 501B are approximately collimated by the collimator lenses 502, 503, and 504, and are combined by the two dichroic mirrors 505 and 506. The light intensity of the combined laser beams is adjusted by the light-intensity adjuster 507, and then two-dimensional scanning is performed by the movable device 13 provided with the reflecting surface 14. The projection light L that has been two-dimensionally scanned by the movable device 13 is reflected by the free-form surface mirror 509 so as to correct the distortion, and then is concentrated onto the intermediate screen 510 thus to display an intermediate image. The intermediate screen 510 includes a microlens array in which a plurality of microlenses are two-dimensionally arranged, and expands the projected light L incident on the intermediate screen 510 in units of microlens.

The movable device 13 moves the reflecting surface 14 biaxially in a reciprocating manner to perform two-dimensional scanning with the projection light L incident on the reflecting surface 14. The driving of the movable device 13 is controlled in synchronization with the light-emitting timings of the laser-beam sources 501R, 501G, and 501B.

In the above description, the HUD 500 is described as an example of the image projection apparatus. However, no limitation is indicated thereby, and the image projection apparatus may be any apparatus that performs optical scanning, using the movable device 13 provided with the reflecting surface 14, to project an image. For example, the present disclosure is also applicable to a projector that is placed on a desk or the like and projects an image on a display screen, a head-mounted display device that is incorporated in a wearable member on the head of the observer, for example, and that projects an image on a reflective-and-transmissive screen of the wearable member or on an eyeball as a screen, and the like.

The image projection apparatus may be incorporated in, not only a vehicle or the wearable member, but also, for example, a mobile object such as an aircraft, a ship, or a moving robot, and an immobile object such as an operation robot that operates a driving target such as a manipulator without moving from the installed location.

An optical writing device that is provided with the movable device 13 according to the above embodiment is described below in detail with reference to FIGS. 7 and 8.

Figure 7:
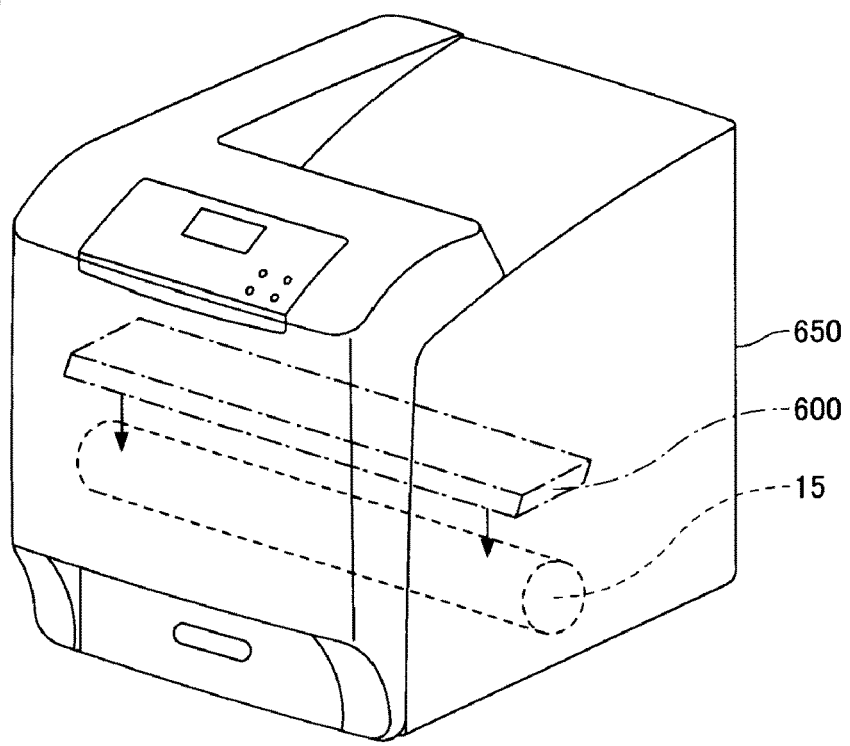
FIG. 7 is a schematic view of an image forming apparatus equipped with an optical writing device, according to an embodiment of the present disclosure.

FIG. 7 is an illustration of an example of an image forming apparatus equipped with an optical writing device 600. FIG. 8 is a schematic view of an example of the optical writing device 600.

As illustrated in FIG. 7, the optical writing device 600 is used as a component of an image forming apparatus typified by a laser printer 650, for example, having printer functions using laser beams. In the image forming apparatus, the optical writing device 600 performs optical scanning on a photoconductor drum, which is the target surface 15, by using one or more laser beams, thereby performing optical writing on the photoconductor drum.

Figure 8:
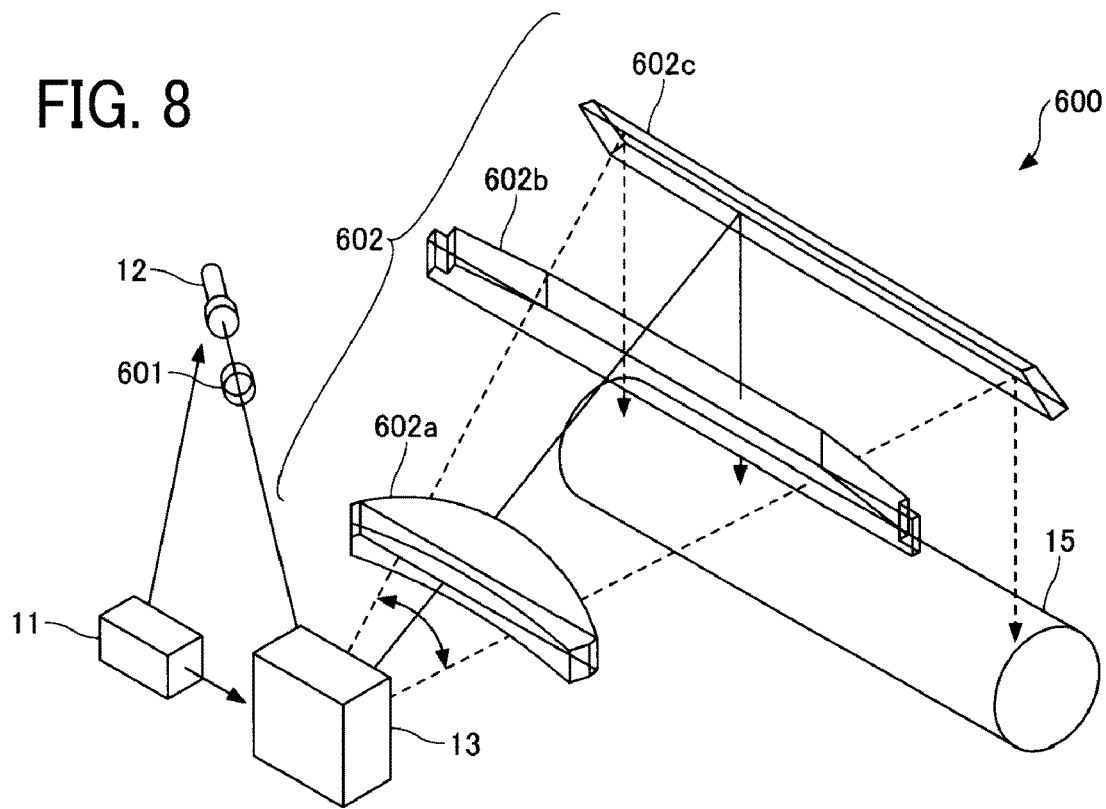
FIG. 8 is a schematic view of the optical writing device according to an embodiment of the present disclosure.

As illustrated in FIG. 8, in the optical writing device 600, a laser beam from the light-source device 12 such as a laser element passes through an image forming optical system 601 such as a collimator lens and is then deflected uniaxially or biaxially by the movable device 13 having the reflecting surface 14. The laser beam deflected by the movable device 13 passes through a scanning optical system 602 including a first lens 602a, a second lens 602b, and a reflecting mirror unit 602c, and is emitted onto the target surface 15 (e.g., a photoconductor drum or photosensitive paper), and thereby optical writing is performed. The scanning optical system 602 forms a laser beam in the form of a spot on the target surface 15. The light-source device 12 and the movable device 13 including the reflecting surface 14 are driven based on the control of the control device 11.

The optical writing device 600 is used as a component of an image forming apparatus having a printer function using laser beams. Moreover, by employing another scanning optical system to perform scanning in a biaxial manner in addition to the uniaxial manner, the optical writing device 600 can also be used as a component of an image forming apparatus such as a laser label apparatus that deflects laser beams to perform optical scanning on thermal media and print letters by heating.

The movable device 13 is advantageous in saving power of the optical writing device 600 because the power consumption for driving the movable device 13 is less than the power consumption for driving a polygon mirror or the like. The movable device 13 makes a smaller wind noise when the reflector base oscillates compared with a rotational polygon mirror, and thus is advantageous in achieving low noise of the optical writing device 600. The optical writing device 600 requires much smaller installation space than the installation space of a rotational polygon mirror, and the amount of heat generated by the movable device 13 is small. Consequently, downsizing is easily achieved, and thus the optical writing device is advantageous in downsizing the image forming apparatus.

A distance-measuring apparatus provided with the movable device 13 according to the above embodiment is described with reference to FIG. 9 and FIG. 10.

Figure 9:
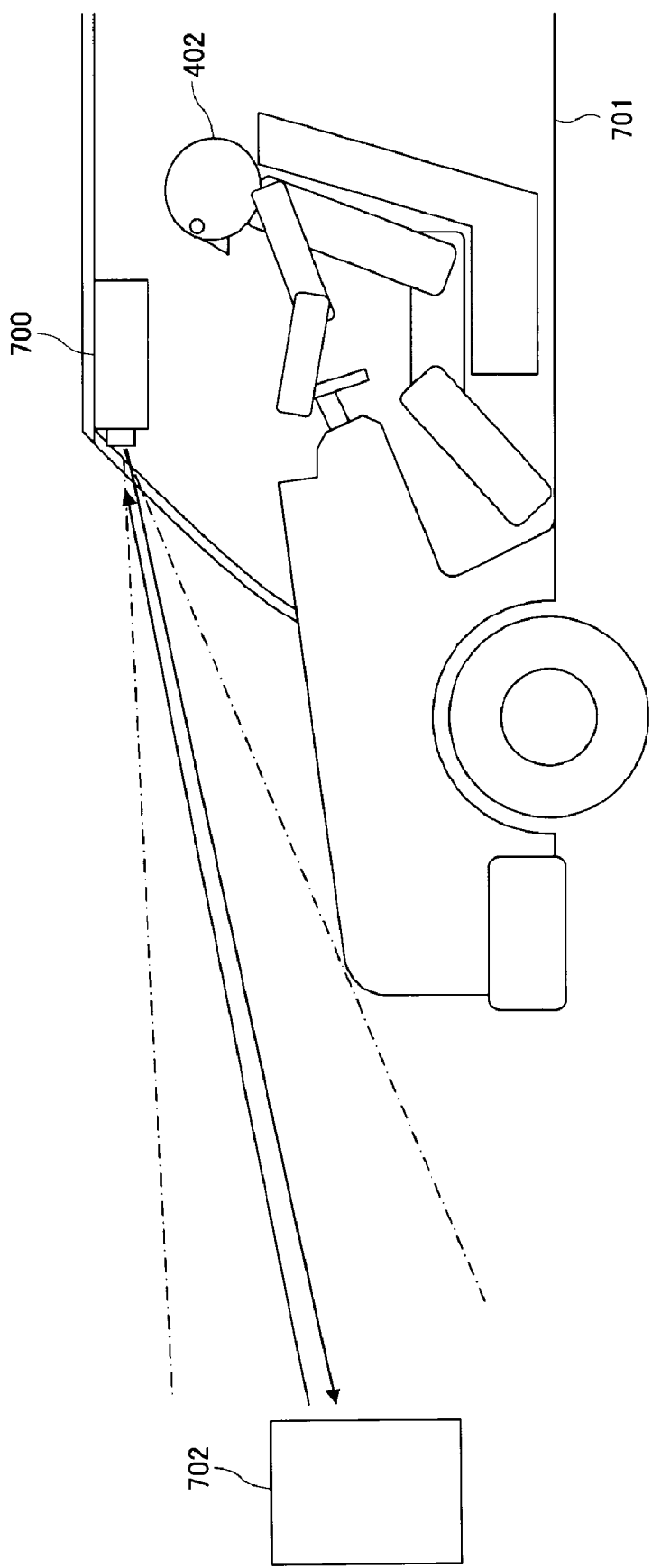
FIG. 9 is a schematic view of a vehicle equipped with a laser imaging detection and ranging (LiDAR) device, according to an embodiment of the present disclosure.

FIG. 9 is a schematic view of a vehicle equipped with a LiDAR device as an example of a distance-measuring apparatus. FIG. 10 is a schematic view of an example of a LiDAR device 700.

The distance measuring apparatus measures a distance in a direction to the target (i.e., a target direction).

As illustrated in FIG. 9, for example, the LiDAR device 700 is mounted on a vehicle 701 to perform optical scanning in a target direction and receive the light reflected from an object 702 that exists in the target direction. Thus, the LiDAR device 700 can measure the distance to the object 702.

Figure 10:
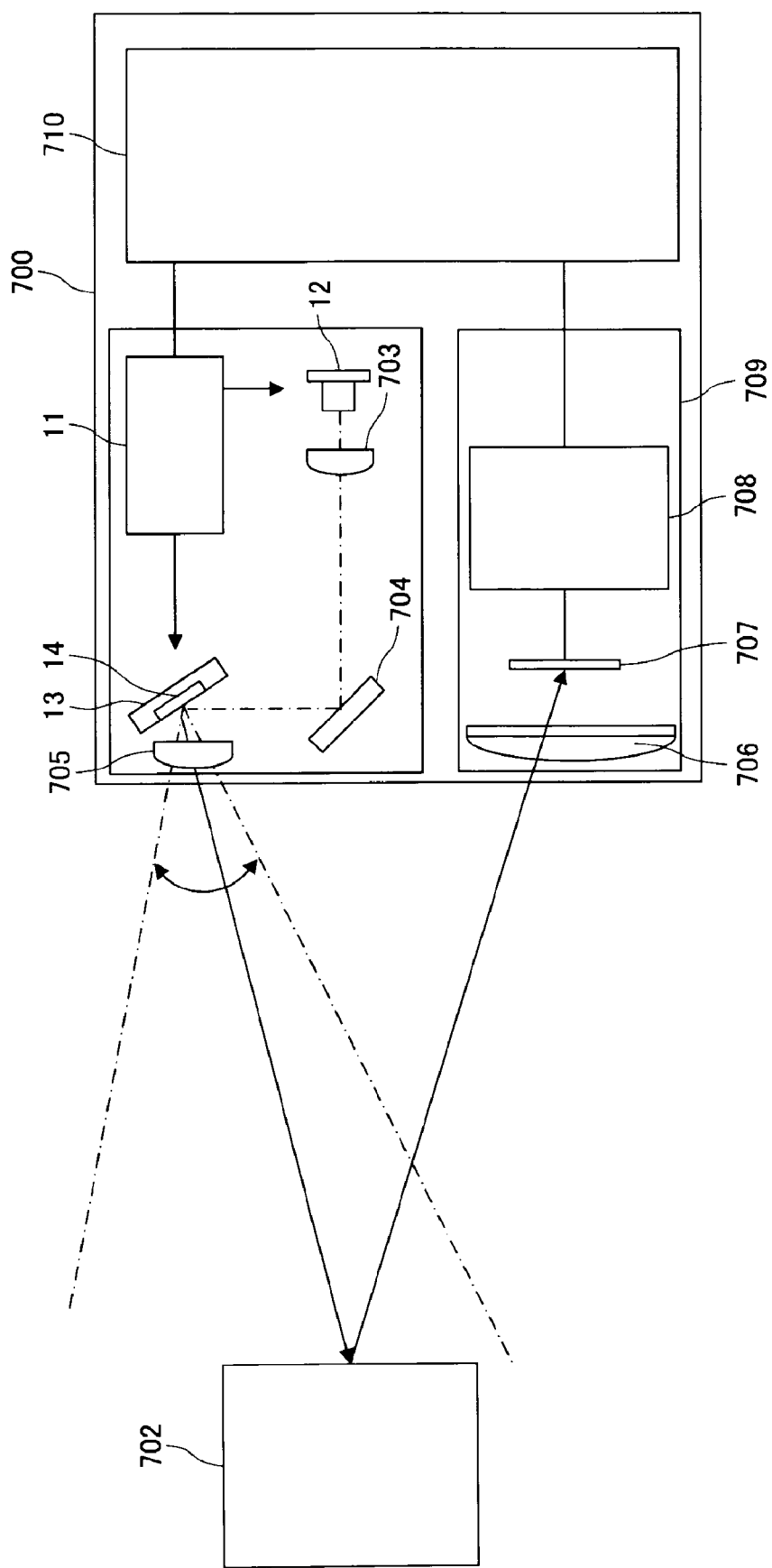
FIG. 10 is a schematic view of the LiDAR device according to an embodiment of the present disclosure.

As illustrated in FIG. 10, the laser beams emitted from a light-source device 12 pass through an incident optical system, and then are caused to perform scanning uniaxially or biaxially by the movable device 13 including the reflecting surface 14. The incidence optical system includes a collimator lens 703 that serves as an optical system that collimates divergent beams into approximately parallel beams, and a planar mirror 704. The parallel beams are emitted to the object 702 ahead of the device, as passing through, for example, a projection lens 705 that serves as a projection optical system. The operation of the light-source device 12 and the movable device 13 is controlled by the control device 11. The light that is reflected by the object 702 is detected by a photosensor 709. More specifically, the reflected light passes through, for example, a condenser lens 706 that serves as an incident-light receiving and detecting optical system, and is received by an image sensor 707. Then, the image sensor 707 outputs a detected signal to a signal processing circuit 708. The signal processing circuit 708 performs predetermined processing, such as binarization or noise processing, on the received detected signal, and outputs the results to a distance measuring circuit 710.

The distance measuring circuit 710 determines whether the object 702 is present based on the time difference between the timing at which the light-source device 12 emits laser beams and the timing at which the photosensor 709 receives the laser beams or the phase difference per pixel of the image sensor 707 that have received the laser beams. Moreover, the distance measuring circuit 710 calculates distance information indicating the distance from the object 702.

The movable device 13 provided with the reflecting surface 14 is less likely to be broken and is more compact than a polygon mirror, and thus, a highly durable and compact LiDAR device can be provided. Such a LiDAR device is attached to a vehicle, an aircraft, a ship, a robot, or the like, and can perform optical scanning within a predetermined range to determine whether an obstacle is present or to measure the distance to the obstacle. Note that the position to which the LiDAR device 700 is attached is not limited to the front and upper side of the vehicle 701, but may be attached to a side or on the rear of the vehicle 701.

In the above description, the LiDAR device 700 is described as an example. However, no limitation is intended thereby. The distance-measuring apparatus may be any apparatus that performs optical scanning by the control device 11 controlling the movable device 13, and measures a distance to the object 702 by causing the photosensor to receive light reflected from the object 702.

For example, the present disclosure is also applicable to a biometric authentication apparatus, a security sensor, or a component of a three-dimensional scanner, for example. The biometric authentication apparatus performs optical scanning on a hand or face to obtain distance information, calculates object information such as the shape of the object based on the distance information, and refers to records to recognize the object. The security sensor performs optical scanning in a target range to recognize an incoming object. The three-dimensional scanner performs optical scanning to obtain distance information, calculates object information such as the shape of the object based on the distance information to recognize the object, and outputs the object information in the form of three-dimensional data.

Figure 11:
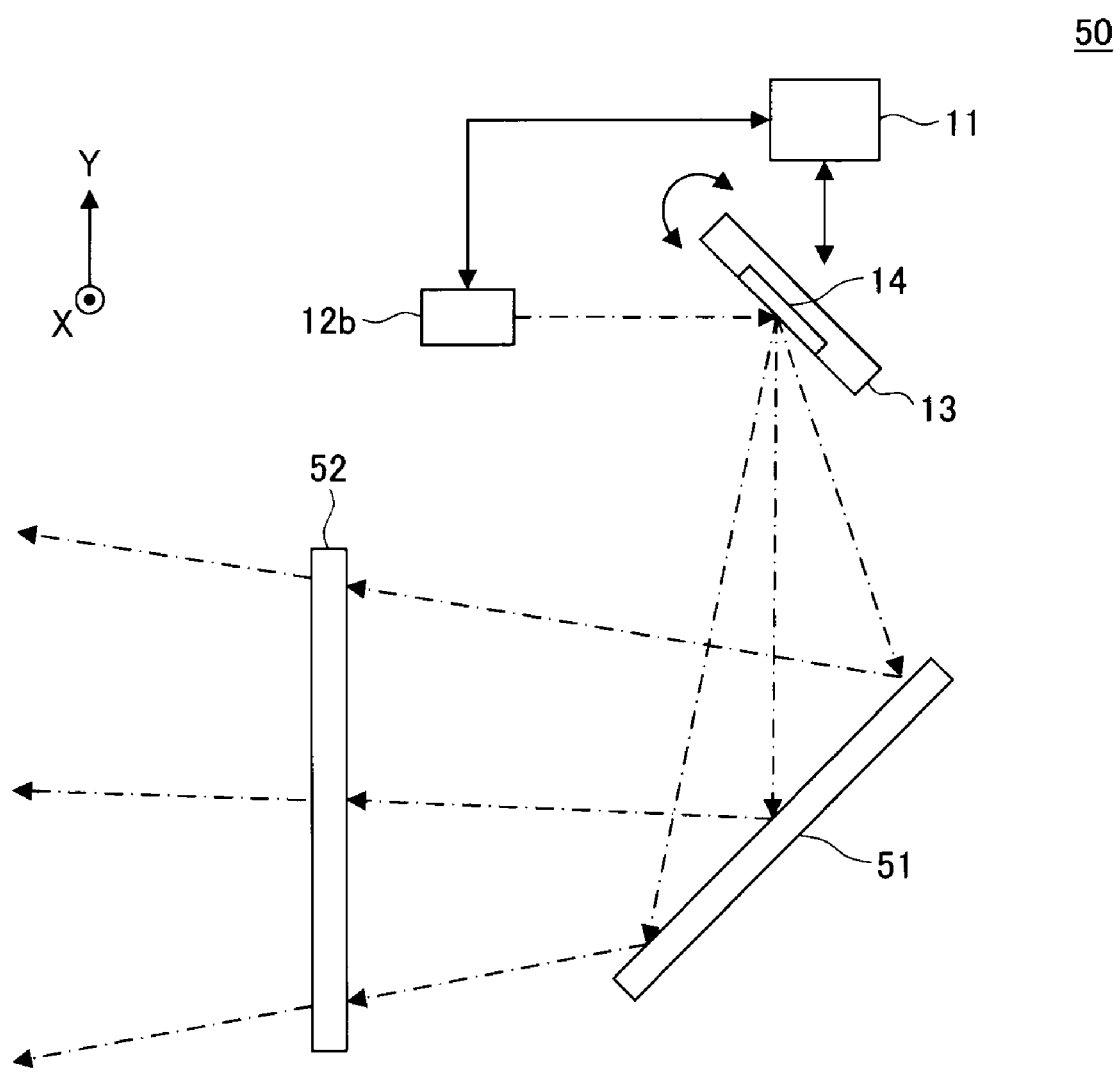
FIG. 11 is an illustration of the configuration of a laser headlamp according to an embodiment of the present disclosure.

A laser headlamp 50 in which the movable device 13 according to the above embodiment is used as a headlight of a vehicle is described below in detail with reference to FIG. 11. FIG. 11 is an illustration of the configuration of a laser headlamp 50 according to an embodiment of the present disclosure.

The laser headlamp 50 includes a control device 11, a light-source device 12b, a movable device 13 including a reflecting surface 14, a mirror 51, and a transparent plate 52.

The light-source device 12b is a light source that emits a blue laser beam. The laser beam emitted from the light-source device 12b is incident on the movable device 13 and is reflected by the reflecting surface 14. The movable device 13 moves (drives) the reflecting surface 14 in the XY-direction based on the signal from the control device 11, and performs two-dimensional scanning using the blue laser beam emitted from the light-source device 12b in the XY-direction.

The scanning light of the movable device 13 is reflected by the mirror 51, and is incident on the transparent plate 52. The transparent plate 52 is coated with a yellow phosphor on the front surface or the back surface. The blue laser beams that are reflected by the mirror 51 are converted into white light whose color is within the range of the statutory color for a headlight as passing through the yellow phosphor (fluorescent material) of the transparent plate 52. Accordingly, the front of the vehicle is illuminated with white light from the transparent plate 52.

The scanning light of the movable device 13 scatters in a predetermined manner as passing through the fluorescent material of the transparent plate 52. Accordingly, glare is attenuated at an illuminated target in the area ahead of the automobile.

When the movable device 13 is applied to a headlight of a vehicle, the color of light beams from the light-source device 12b and the color of the phosphor are not limited to blue and yellow, respectively. For example, the light-source device 12b may emit near-ultraviolet light, and the transparent plate 52 may be coated with homogenized mixture of a plurality of kinds of fluorescent materials of red-green-blue (RGB) trichromatic colors. In this case as well, the light passing through the transparent plate 52 can be converted into white light, and the front of the vehicle can be illuminated with white light.

A head-mounted display (HMD) 60 to which the movable device 13 according to the above embodiment is applied is described below in detail with reference to FIG. 12 and FIG. 13. Note that the HMD 60 is a head-mounted display that can be mounted on a human head, and can be shaped like glasses. In the following description, such a head-mounted display may be referred to simply as an HMD.

Figure 12:
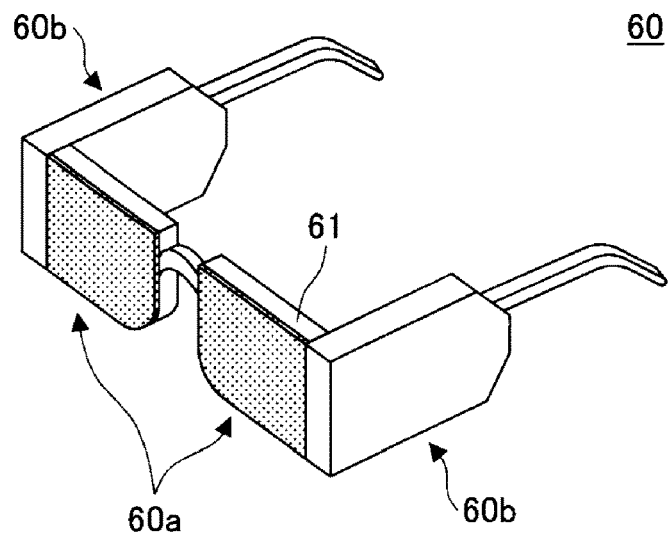
FIG. 12 is a schematic perspective view of the configuration of a head-mounted display (HMD) according to an embodiment of the present disclosure.

FIG. 12 is a perspective view of the appearance of the HMD 60. In FIG. 12, the MID 60 includes a pair of a front 60a and a temple 60b on each of the left and right, which are approximately symmetrically arranged. The front 60a can include, for example, a light guide plate 61. An optical system, a control device, and the like, can be incorporated in the temple 60b.

Figure 13:
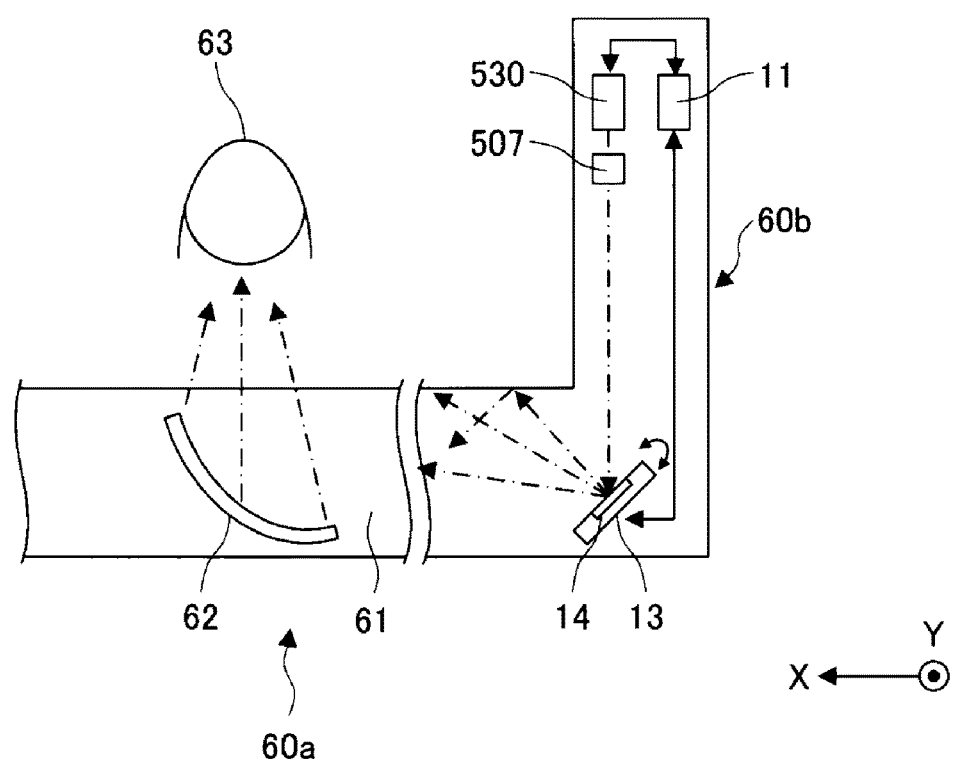
FIG. 13 is an illustration of the configuration of the HMD according to an embodiment of the present disclosure.

FIG. 13 is an illustration of a configuration of a part of the HMD 60. Although the configuration for the left eye is illustrated in FIG. 13, the HMD 60 has a configuration similar to that for the right eye.

The HMD 60 includes a control device 11, a light source unit 530, a light-intensity adjuster 507, a movable device 13 including a reflecting surface 14, a light guide plate 61, and a half mirror 62.

As described as above with reference to FIG. 6, the light source unit 530 according to the present embodiment includes the laser-beam sources 501R, 501G, and 501B, the collimator lenses 502, 503, and 504, and the dichroic mirrors 505 and 506, and these elements are combined as a single unit serving as an optical housing. In the light source unit 530, the laser beams of the RGB colors that are emitted from the laser-beam sources 501R, 501G, and 501B are combined by the two dichroic mirrors 505 and 506. The combined parallel light is emitted from the light source unit 530.

The light intensity of the combined laser beams from the light source unit 530 is adjusted by the light-intensity adjuster 507, and then the light is incident on the movable device 13. The movable device 13 moves the reflecting surface 14 in the XY-direction based on the signal from the control device 11, and performs two-dimensional scanning with the light emitted from the light source unit 530. The driving of the movable device 13 is controlled in synchronization with the light emission timings of the laser-beam sources 501R, 501G, and 501B, and a color image is formed with the scanning light.

The scanning light of the movable device 13 is incident on the light guide plate 61. The light guide plate 61 reflects the scanning light on the inner wall, and guides the scanning light to the half mirror 62. The light guide plate 61 is formed by, for example, resin that has transparency to the wavelength of the scanning light.

The half mirror 62 reflects the light that is guided through the light guide plate 61 to the rear side of the HMD 60, and the reflected light exits towards an eye of an wearer 63 of the HMD 60. The half mirror 62 has a free-form surface shape. The scanning light is reflected by the half mirror 62, and the image is formed on the retina of wearer 63. The image of the scanning light is formed on the retina of the wearer 63 due to the reflection at the half mirror 62 and the effect of the crystalline lenses of eyeballs. Moreover, due to the reflection at the half mirror 62, the spatial distortion of the image is corrected. The wearer 63 can observe an image formed by the light of scanning in the XY direction.

The wearer 63 observes an image of external light superposed on the image of the scanning light because of the half mirror 62. The half mirror 62 may be replaced with a mirror to exclude the extraneous light. In such a configuration, only the image that is formed by scanning light can be observed.

The movable device 13 that is packaged, according to the present embodiment, is described below with reference to FIG. 14.

Figure 14:
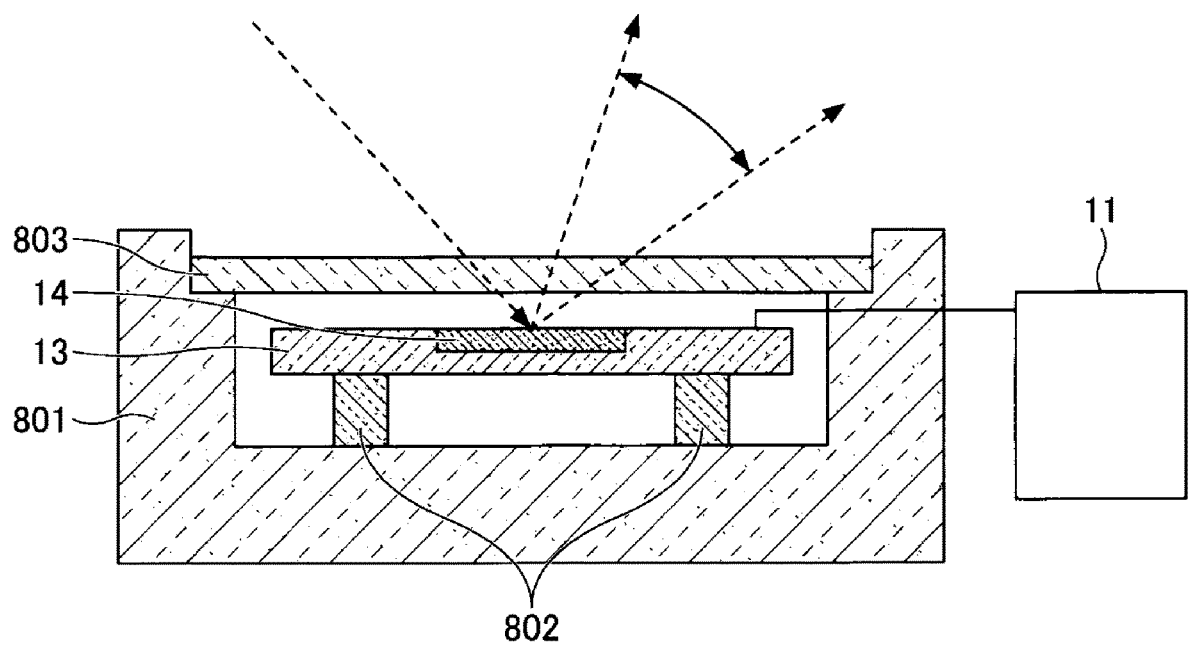
FIG. 14 is a schematic view of a packaged movable device.

FIG. 14 is a schematic view of an example of a packaged movable device 13.

As illustrated in FIG. 14, the movable device 13 is mounted on a mounting member 802 inside a package member 801. The package member 801 is partly covered with and sealed by a transmissive member 803 so that the movable device 13 is packaged. The package contains inert gas such as nitrogen and is sealed. This configuration can substantially prevent the deterioration of the movable device 13 due to oxidation, and increase the durability against changes in environment such as temperature.

A movable device 13 according to a first embodiment that is used for the above-described optical deflection system, optical scanning system, image projection apparatus, optical writing device, and distance-measuring apparatus is described.

Next, a configuration of a movable device 13 is described with reference to FIG. 15, FIGS. 16A, 16B, and 16C.

Figure 15:
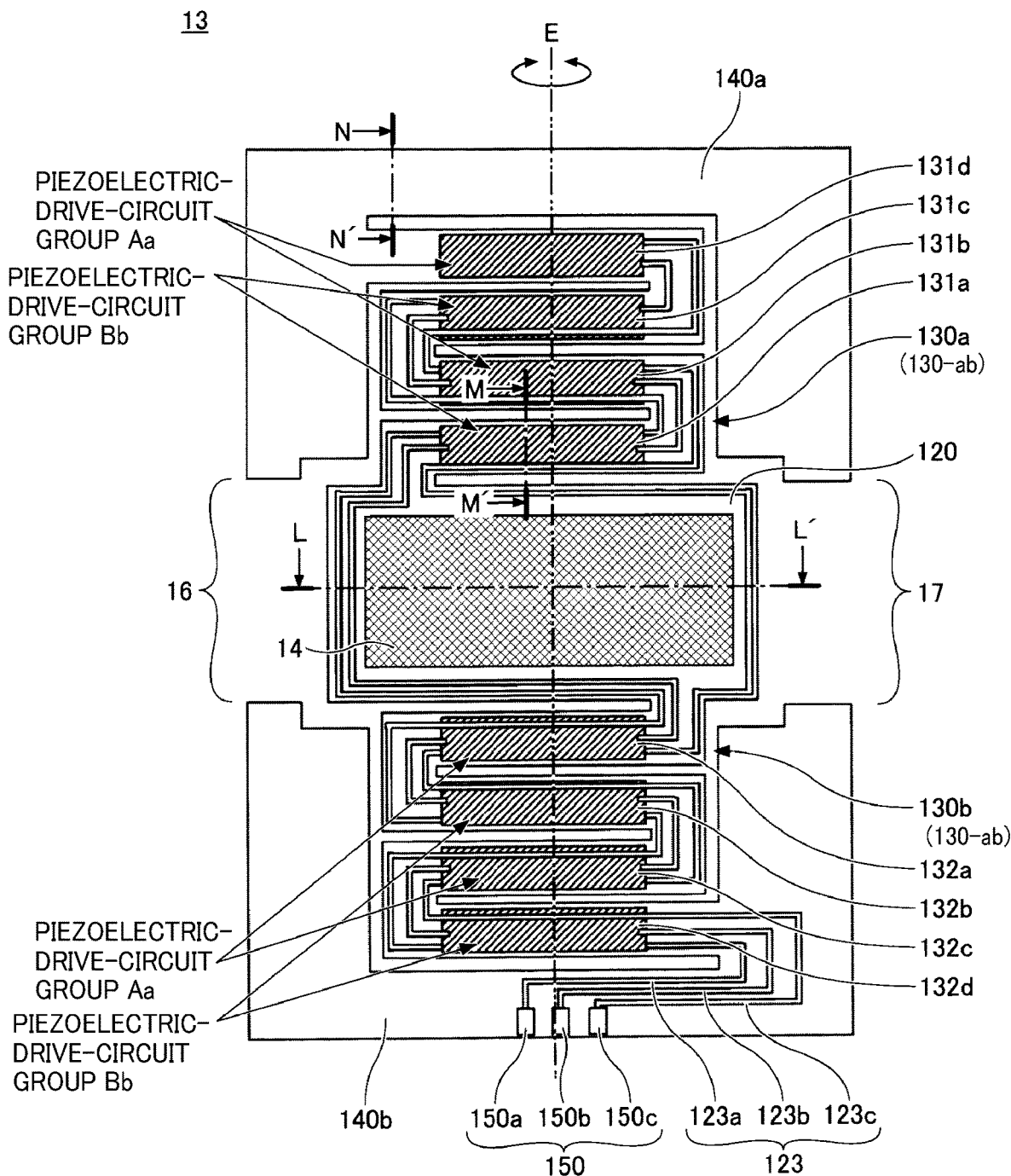
FIG. 15 is a plan view of a movable device according to a first embodiment of the present disclosure.
Figure 16A:
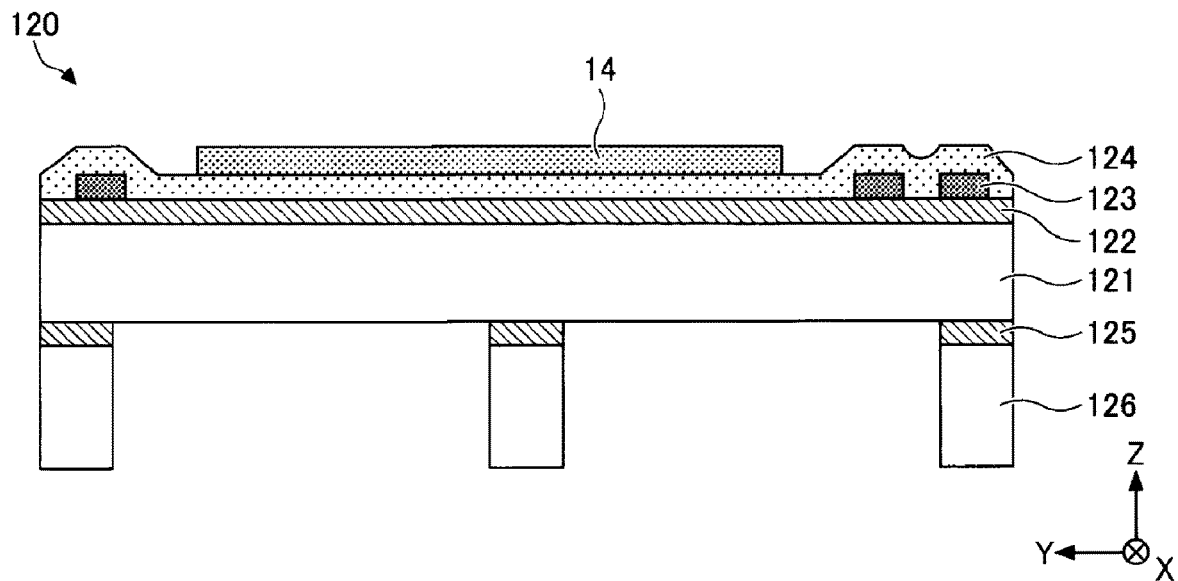
FIG. 16A is a cross-sectional view of the movable device taken along line L-L' in FIG. 15.
Figure 16B:
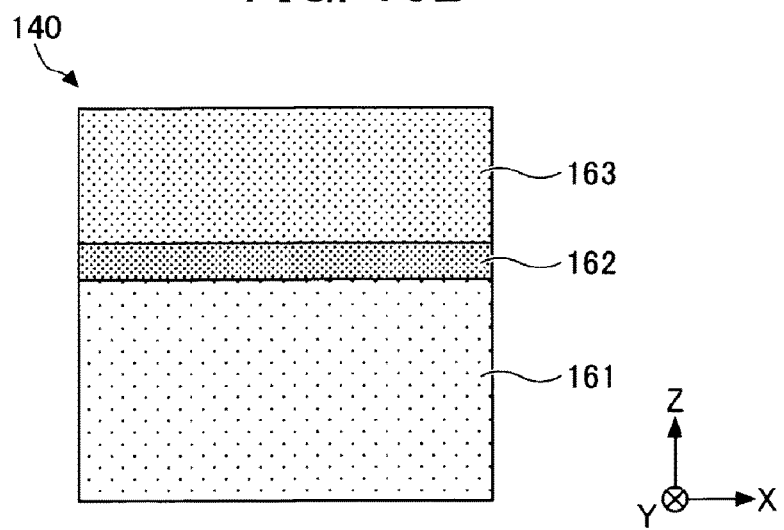
FIG. 16B is a cross-sectional view of the movable device taken along line N-N' in FIG. 15.
Figure 16C:
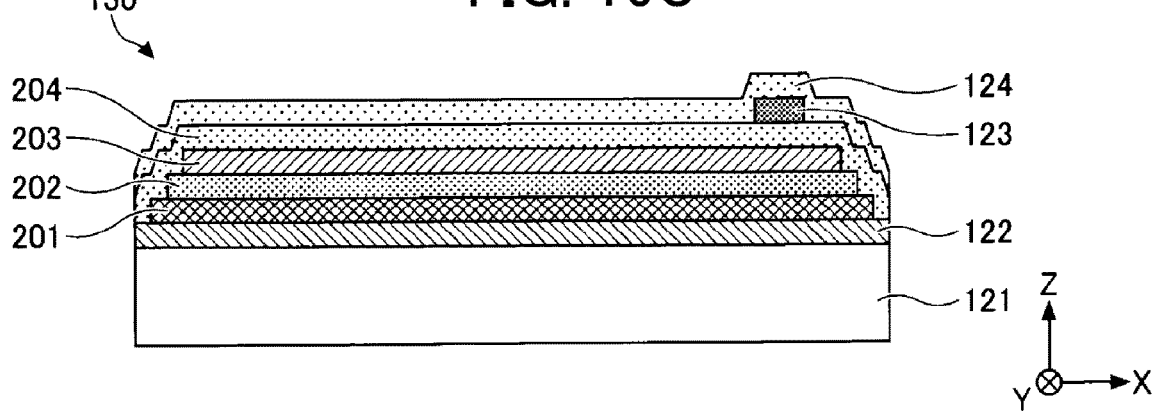
FIG. 16C is a cross-sectional view of the movable device taken along line M-M' in FIG. 15.

FIG. 15 is a plan view of a movable device 13 that is doubly supported and can uniaxially deflect light. FIG. 16A is a cross-sectional view of the movable device 13 taken along line L-L' in FIG. 15. FIG. 16B is a cross-sectional view of the movable device taken along line N-N' in FIG. 15. FIG. 16C is a cross-sectional view of the movable device taken along line M-M' in FIG. 15.

As illustrated in FIG. 15, the movable device 13 includes a reflecting surface 14 that reflects incident light, a reflector 120 on which the reflecting surface 14 is formed, drive beams 130*a* and 130*b*, which are collectively referred to as a drive beam 130 when they are not distinguished from each other, and supporting parts 140*a* and 140*b*, which are collectively referred to as a supporting part 140 when they are not distinguished from each other. FIG. 15 illustrates the reflecting surface 14 as an example of a rectangular reflecting surface; however, it is not limited thereto, and the shape of a reflecting surface may be another shape, such as a circle or an ellipsoid.

The drive beam 130 (the drive beams 130*a* and 130*b*) is connected to the reflector 120, and the reflector 120 is caused to oscillate about an E-axis parallel to the X-axis, so as to cause the reflecting surface 14 to oscillate. The supporting part 140*a* supports the drive beam 130*a*, and the supporting part 140*b* supports the drive beam 130*b*.

The drive beam 130*a* has a meandering structure in which a plurality of beams 130-*ab* are joined to turn. One end of the drive beam 130*a* is coupled to an outer peripheral portion of the reflector 120, and the other end of the drive beam 130*a* is coupled to an inner peripheral portion of the supporting part 140*a*. In addition, the drive beam 130*a* is configured to include piezoelectric drive circuits 131*a* to 131*d*. The piezoelectric drive circuits 131*a* to 131*d* deform the drive beam 130*a* so as to cause the reflector 120 to oscillate.

The drive beam 130*b* also has a meandering structure in which a plurality of beams 130-*ab* is joined to turn. One end of the drive beam 130*b* is coupled to an outer peripheral portion of the reflector 120, and the other end of the drive beam 130*b* is coupled to an inner peripheral portion of the supporting part 140*b*. In addition, the drive beam 130*b* is configured to include piezoelectric drive circuits 132*a* to 132*d*. The piezoelectric drive circuits 132*a* to 132*d* deform the drive beam 130*b* so as to cause the reflector 120 to oscillate.

The location where the drive beam 130*a* is connected to the reflector 120 and the location where the drive beam 130*b* is connected to the reflector 120 are arranged point-symmetrically with respect to the center of the reflecting surface 14. Further, the location where the drive beam 130*a* is connected to the supporting part 140*a* and the location where the drive beam 130*b* is connected to the supporting part 140*b* are arranged point-symmetrically with respect to the center of the reflecting surface 14.

An electrode connecting part 150 for receiving a voltage signal from the control device 11 is provided on the +Z-side surface of the supporting part 140*b*. The electrode connecting part 150 includes a positive electrode connecting part 150*a* to which a positive voltage is applied, a ground (GND) connecting part 150*b* connected to the GND, and a negative electrode connecting part 150*c* to which a negative voltage is applied.

In addition, wiring 123 is provided on a region other than the reflecting surface 14 on the surface of the reflector 120 and on each surface of the drive beams 130*a* and 130*b*. A voltage signal input to the electrode connecting part 150 is transmitted through wires 123 to each of the piezoelectric drive circuits 132a to 132d and also to each of the piezoelectric drive circuits 131a to 131d through the reflector 120.

In other words, the piezoelectric drive circuits 131a to 131d of the drive beam 130a are electrically connected by the wires 123 to the electrode connecting part 150 on the supporting part 140b via the reflector 120. The drive voltage input to the electrode connecting part 150 is applied to both the drive beams 130a and 130b through the wires 123.

More specifically, the wires 123 are provided on the surface of the supporting part 140b and the surfaces of the beams 130-ab of the drive beam 130b so that each of the piezoelectric drive circuits 132a to 132d is electrically connected to the electrode connecting part 150. Further, the wires 123 are provided on the surface of the reflector 120 along the periphery of the reflector 120 so that the piezoelectric drive circuit 132a and the piezoelectric drive circuit 131a are electrically connected to each other via the reflector 120. Further, the wires 123 are provided on the surfaces of the beams 130-ab of the drive beam 130a so that the piezoelectric drive circuits 131a to 131d are electrically connected to each other.

The wires 123 includes a positive voltage conducting wire 123a through which a positive voltage signal is transmitted, a GND conducting wire 123b connected to the GND, and a negative voltage conducting wire 123c through which a negative voltage signal is transmitted. The positive voltage conducting wire 123a is connected to the positive electrode connecting part 150a. The GND conducting wire 123b is connected to the GND connecting part 150b. The negative voltage conducting wire 123c is connected to the negative electrode connection part 150c.

The drive beam 130b is an example of a first movable unit, and the drive beam 130a is an example of a second movable unit. Each of the piezoelectric drive circuits 132a to 132d is an example of a first piezoelectric element, and each of the piezoelectric drive circuits 131a to 131d is an example of a second piezoelectric element.

The supporting part 140b is an example of a first supporting part, the supporting part 140a is an example of a second supporting part, the electrode connecting part 150 is an example of a voltage input part, that is, an input part. A set of wires 123 is an example of a wire connecting the second piezoelectric element and the voltage input part. The positive voltage conducting wire 123a, the GND conducting wire 123b, and the negative voltage conducting wire 123c are an example of a plurality of conducting wires that constitutes the wires 123.

An opening area where the supporting part 140 (the supporting parts 140a and 140b) does not exist is provided at each side of the reflector 120 along the Y direction. Such an opening area defines light passing areas 16 and 17. The light passing areas 16 and 17 enables light reflected by the reflecting surface 14 to be transmitted therethrough when the reflector 120 oscillates. The light passing areas 16 and 17 may be an air gap where any element does not exit, or may include a member that transmits light, such as glass, at at least a part of such an air gap. In one example, the light passing areas 16 and 17 each has a tapered shape in which the width parallel with the E axis increases with an increase in the distance from the E-axis. Each of the light passing areas 16 and 17 is an example of a passage area.

The movable device 13 includes, one silicon on insulator (SOI) substrate that is formed by any appropriate treatment method, such as etching. On the formed SOI substrate, the reflecting surface 14, the drive beam 130, and the electrode connecting part 150 are formed, which constitutes a single integrated unit of the above-described components. The above-described multiple elements may be formed after the SOI substrate is molded or may be formed while the SOI substrate is being molded.

The SOI substrate is a substrate in which, on a first silicon layer formed of single crystal silicon (Si), a silicon oxide layer is formed, and on the silicon oxide layer, a second silicon layer formed of single crystal silicon is further formed. Hereinafter, the first silicon layer is referred to as silicon support layer, and the second silicon layer is referred to as silicon active layer.

The silicon active layer has a smaller thickness in the Z-direction than those in the X-direction and the Y-direction. With such a configuration, any member made of only the silicon active layer is deformed by a force applied by, for example, the piezoelectric drive circuits 131a to 131d and 132a to 132d.

The SOI substrate does not have to be planar, and may have, for example, a curvature. As long as the substrate can be integrally processed by etching or the like and can be partially elastic, the member used for forming the movable device 13 is not limited to the SOI substrate.

As illustrated in FIG. 16A, the reflector 120 includes a silicon active layer 121, an interlayer insulator film 122 on the +Z-side surface of the silicon active layer 121, a wire 123 and a protection film 124 on the +Z-side surface of the interlayer insulator film 122, and a reflecting surface 14 on the +Z-side surface of the protection film 124. The reflector 120 also includes a buried oxide (BOX) layer 125 on the −Z-side surface of the silicon active layer 121, and a silicon support layer 126 on the −Z-side surface of the BOX layer 125.

The interlayer insulating film 122 includes silicon oxide or the like. The wire 123 contains aluminum (Al). The protection film 124 includes silicon oxide or photosensitive polyimide. The reflecting surface 14 includes a thin metal film containing aluminum, gold, silver, or the like. The material forming the protection film 124 enables visible light to pass therethrough.

The BOX layer 125 includes silicon oxide. The BOX layer 125 and the silicon support layer 126 act as a reinforcing rib to prevent the distortion of the reflecting surface 14 due to the motion.

As illustrated by FIG. 16B, the supporting part 140 (the supporting parts 140a and 140b) includes a silicon supporting layer 161, a silicon oxide layer 162 formed on the +Z-side surface of the silicon supporting layer 161, and a silicon active layer 163 formed on the +Z-side surface of the silicon oxide layer 162.

As illustrated in FIG. 16C, the drive beam 130 (the drive beams 130a and 130b) includes an interlayer insulator film 122, a lower electrode 201, a piezoelectric circuit 202, an upper electrode 203, an interlayer insulator film 204, a wire 123, and a protection film 124, which are formed in that order on the +Z-side surface of the silicon active layer 121 that serves as an elastic member. The piezoelectric circuit 202 constitutes the piezoelectric drive circuits 131a to 131d and 132a to 132d.

The upper electrode 203 and the lower electrode 201 includes gold (Au) or platinum (Pt). The piezoelectric circuit 202 includes, for example, lead zirconate titanate (PZT) as piezoelectric material.

The electrode connecting part 150 is electrically connected by the wire 123 to the upper electrode 203 and the lower electrode 201 of each of the piezoelectric drive circuits 131a to 131d and 132a to 132d. In addition, the electrode connecting part 150 is electrically connected to the control device 11 through electrode wiring. The upper electrode 203 or the lower electrode 201 may be directly connected to the electrode connecting part 150. Alternatively, the upper electrode 203 and the lower electrode 201 may be connected to each other, to be indirectly connected to the electrode connecting part 150.

More specifically, the GND conducting wire 123b of the wire 123 is coupled to the upper electrode 203 of each of the piezoelectric drive circuits 131a to 131d and 132a to 132d. Moreover, the positive voltage conducting wire 123a is coupled to the lower electrode 201 of each of the piezoelectric drive circuits 132d, 132b, 131a, and 131c, transmits a positive voltage signal thereto, and applies a positive drive voltage thereto. In this case, the positive voltage conducting wire 123a is not coupled to the lower electrode 201 of each of the piezoelectric drive circuits 132c, 132a, 131b, and 131d, and passes through the piezoelectric drive circuits 132c, 132a, 131b, and 131d.

The negative voltage conducting wire 123c is coupled to the lower electrode 201 of each of the piezoelectric drive circuits 132c, 132a, 131b, and 131d, transmits a negative voltage signal thereto, and applies a negative drive voltage thereto. In this case, the negative voltage conducting wire 123c is not coupled to the lower electrode 201 of each of the piezoelectric drive circuits 132d, 132b, 131a, and 131c, and passes through the piezoelectric drive circuits 132d, 132b, 131a, and 131c.

In this way, the wire 123 transmits a voltage signal input through the electrode connecting part 150 to the piezoelectric drive circuits 131a to 131d and 132a to 132d, and thus apply a drive voltage to the piezoelectric drive circuits 131a to 131d and 132a to 132d. Alternatively, the wire 123 may transmit a current signal instead of the voltage signal.

In this case, in the interlayer insulator film 204 provided with the wire 123, the insulator film may be partly removed or may not be partly provided as an opening at a coupling spot where the upper electrode 203 or the lower electrode 201 and the electrode wiring are coupled. Thus, the drive beams 130a and 130b, and the electrode wiring can be designed with a higher degree of freedom, and furthermore, a short circuiting due to the contact between electrodes can be prevented. The silicon oxide film constituting the interlayer insulator film 204 also serves as an anti-reflection member.

Although this embodiment has illustrated an example in which the piezoelectric circuit 202 is formed on a surface (+Z-side surface) of the silicon active layer 121 serving as the elastic member, the piezoelectric circuit 202 may be formed on another surface (for example, −Z-side surface) of the elastic member, or on both the surface and the other surface of the elastic member.

The shapes of the components are not limited to the shapes in the embodiment as long as the reflector 120 is rotatable around the E-axis.

Next, the method of controlling the drive beam 130 (the drive beams 130a and 130b) of the movable device 13 by the control device is described in detail.

The piezoelectric circuit 202 of the drive beam 130 (the drive beams 130a and 130b), when a positive or negative voltage in the polarization direction is applied thereto, are deformed (for example, expanded or contracted) in proportion to the potential of the applied voltage, and exhibit inverse piezoelectric effect. The drive beam 130 (the drive beams 130a and 130b) moves or causes the reflector 120 to oscillate by using the inverse piezoelectric effect.

In the present embodiment, the angle formed by the XY plane and the reflecting surface 14 of the reflector 120 when the reflecting surface 14 is inclined with reference to the XY plane in the +Z-direction or the −Z-direction is referred to as a deflection angle. Note also that an angle of inclination in the +Z-direction is referred to as a positive deflection angle, and an angle of inclination in the −Z-direction is referred to as a negative deflection angle.

FIGS. 17A to 17D are illustrations of deformation of the drive beam 130 (the drive beams 130a and 130b). In FIGS. 17A, 17B, 17C, and 17D, the reflector 120 is indicated by broken lines.

Figure 17A:
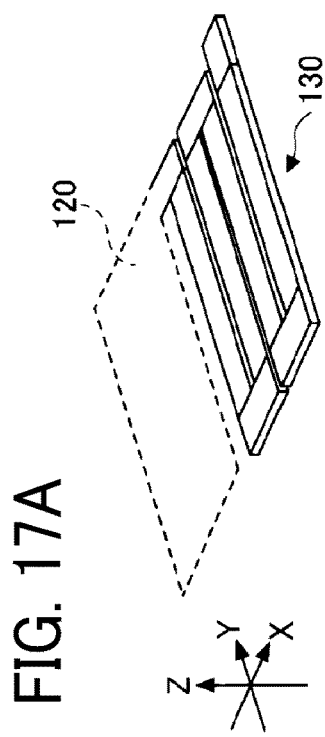
FIGS. 17A to 17D are illustrations of deformation of drive beams of the movable device.

As illustrated in FIG. 17A, the deflection angle by the drive beam 130 is zero when the drive voltage is not applied to the drive beam 130.

Figure 17D:
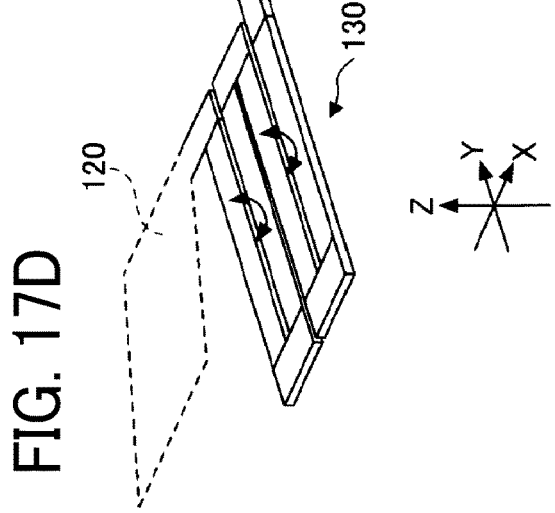

Among the plurality of piezoelectric drive circuits 131a to 131d of the drive beam 130a, the piezoelectric drive circuits 131b and 131d are categorized as a piezoelectric-drive-circuit group Aa, each of which is an even-numbered piezoelectric drive circuit counted from the piezoelectric drive circuit 131a that is closest to the reflector 120 (see FIG. 15). Further, among the plurality of piezoelectric drive circuits 132a to 132d of the drive beam 130b, the piezoelectric drive circuits 132a and 132c are categorized as a piezoelectric-drive-circuit group Aa, each of which is an odd-numbered piezoelectric drive circuit counted from the piezoelectric drive circuit 132a that is closest to the reflector 120. As illustrated in FIG. 17B, the piezoelectric drive circuits of the piezoelectric-drive-circuit group Aa having received the drive voltage applied in parallel (concurrently) deform in a bending manner in the identical direction, so that the reflector 120 rotates around the E-axis in the −Z direction.

Among the plurality of piezoelectric drive circuits 131a to 131d of the drive beam 130a, the piezoelectric drive circuits 131a and 131c are categorized as a piezoelectric-drive-circuit group Bb, each of which is an odd-numbered piezoelectric drive circuit counted from the piezoelectric drive circuit 131a that is closest to the reflector 120 (see FIG. 15). Further, among the plurality of piezoelectric drive circuits 132a to 132d of the drive beam 130b, the piezoelectric drive circuits 132b and 132d are categorized as a piezoelectric-drive-circuit group Bb, each of which is an even-numbered piezoelectric drive circuit counted from the piezoelectric drive circuit 132a that is closest to the reflector 120. As illustrated in FIG. 17D, the piezoelectric drive circuits of the piezoelectric-drive-circuit group Bb having received the drive voltage applied in parallel bend and deform in the identical direction, so that the 120 rotates around the E-axis in the +Z direction.

As illustrated in FIGS. 17B and 17D, in the drive beam 130a or 130b, the plurality of piezoelectric circuits 202 of the piezoelectric-drive-circuit group Aa or the plurality of piezoelectric circuits 202 of the piezoelectric-drive-circuit group Bb concurrently deform in a bending manner. Thus, the movable amount due to bending deformation is accumulated, thereby increasing the deflection angle of the reflector 120 around the E-axis.

As illustrated in FIG. 15, the drive beams 130a and 130b are coupled to the reflector 120 point-symmetrically with respect to the center point of the reflector 120. Thus, when the drive voltage is applied to the piezoelectric-drive-circuit group Aa, a drive force of driving in the +Z direction is generated in the drive beam 130a at the coupling portion of the reflector 120 and the drive beam 130a; and a drive force of driving in the −Z direction is generated in the drive beam 130b at the coupling portion of the reflector 120 and the drive beam 130b. Thus, the movable amount is accumulated and hence the deflection angle of the reflector 120 around the E-axis can be increased.

Figure 17C:
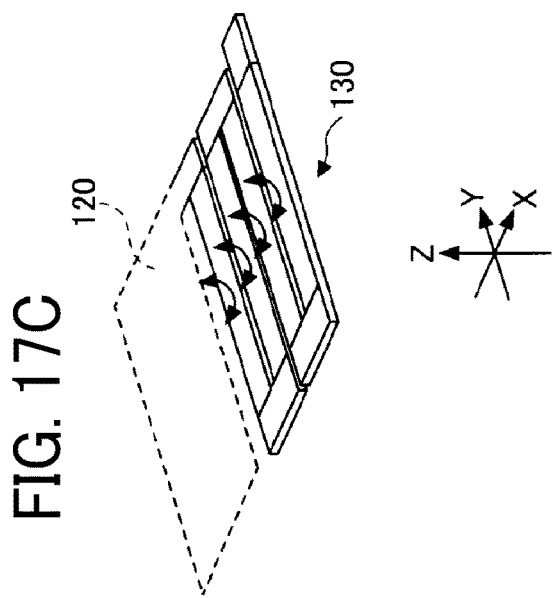
Figure 17B:
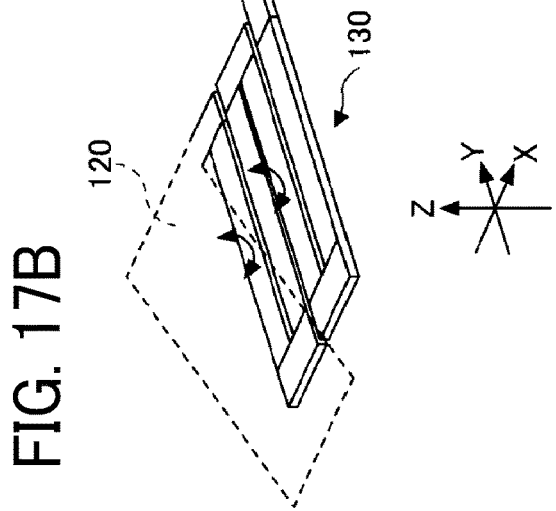

As illustrated in FIG. 17C, the deflection angle is zero when the movable amount of the reflector 120 by the piezoelectric-drive-circuit group Aa due to voltage application is in balance with the movable amount of the reflector 120 by the piezoelectric-drive-circuit group Bb due to voltage application.

The drive voltage is applied to the piezoelectric drive circuits 131a to 131d and 132a to 132d to continuously repeat the actions illustrated in FIGS. 17B to 17D. Thus, the reflector 120 can be driven around the E-axis.

Figure 18A:
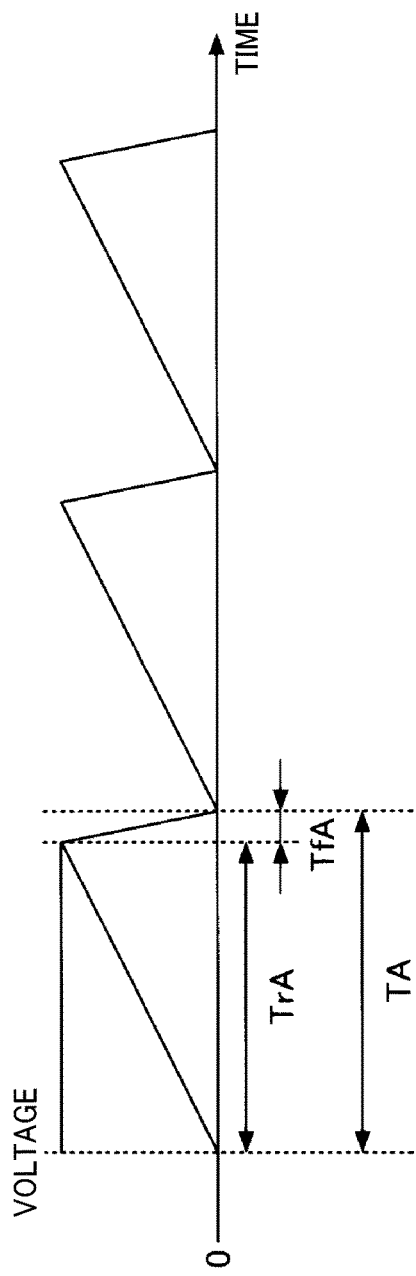
FIG. 18A is an illustration of an example of the waveform of drive voltage A.
Figure 18B:
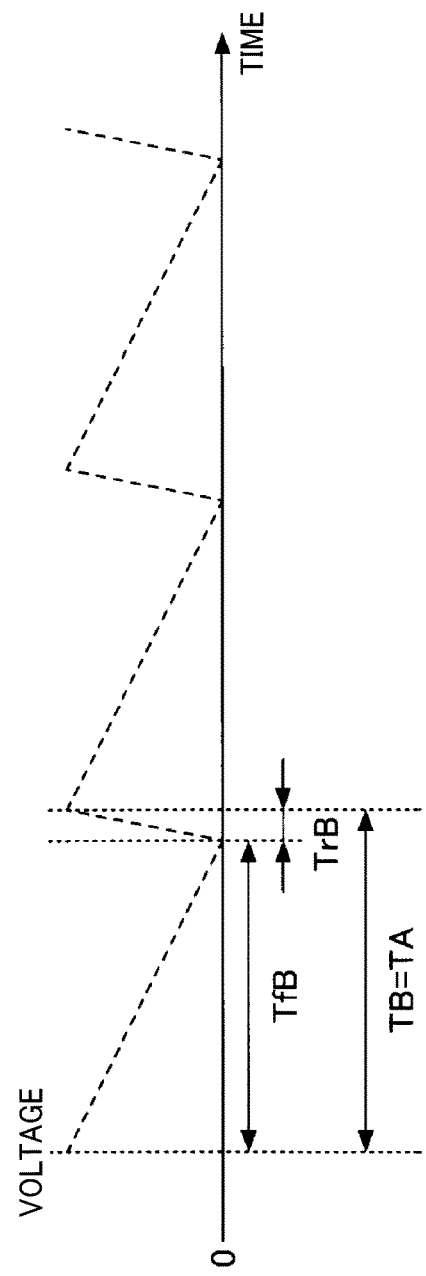
FIG. 18B is an illustration of an example of the waveform of drive voltage B.
Figure 18C:
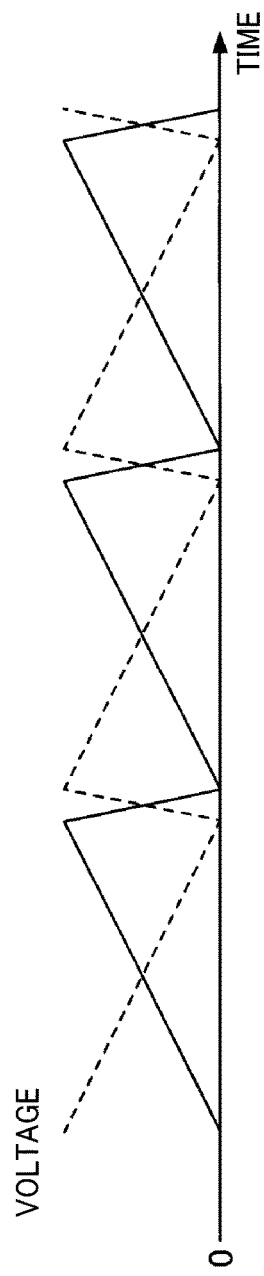
FIG. 18C is an illustration of the waveform of the drive voltage A superimposed on the waveform of the drive voltage B.

The drive voltages that are applied to the drive beam 130 are controlled by the control device 11. The drive voltage that is applied to the piezoelectric-drive-circuit group Aa (hereinafter, drive voltage A) and the drive voltage that is applied to the piezoelectric-drive-circuit group Bb (hereinafter, drive voltage B) are described referring to FIGS. 18A to 18C. FIG. 18A is an illustration of an example of the waveform of drive voltage A. FIG. 18B is an illustration of an example of the waveform of drive voltage B. FIG. 18C is an illustration of the waveform of the drive voltage A superimposed on the waveform of the drive voltage B.

As illustrated in FIG. 18A, for example, the waveform of the drive voltage A is a sawtooth waveform, and the frequency thereof is, for example, 60 Hz. The waveform of the drive voltage A has a preset ratio of TrA:TfA=9:1 where TrA is a time width of a rising duration in which the voltage value increases from a minimum value to a maximum value and TfA is a time width of a falling duration in which the voltage value decreases from the maximum value to a next minimum value. In this case, the ratio of TrA to one cycle is referred to as a symmetry of the drive voltage A.

As illustrated in FIG. 18B, for example, the waveform of the drive voltage B is a sawtooth waveform, and the frequency thereof is, for example, 60 Hz. The waveform of the drive voltage B has a preset ratio of TfB:TrB=9:1 where TrB is a time width of a rising duration in which the voltage value increases from a minimum value to a maximum value and TfB is a time width of a falling duration in which the voltage value decreases from the maximum value to a next minimum value. In this case, the ratio of TfB to one cycle is referred to as a symmetry of the drive voltage B. As illustrated in FIG. 18C, for example, a cycle TA of the waveform of the drive voltage A and a cycle TB of the waveform of the drive voltage B are set to be equal to each other.

The sawtooth waveforms of the drive voltages A and B are generated by superimposing multiple sine waves on top of one another. In the embodiment, the drive voltages in the sawtooth waveforms are used for the drive voltages A and B; however, no limitation is intended thereby. The waveforms can be changed in accordance with the device characteristics of the movable device 13. The device characteristics include, for example, a drive voltage with a waveform in which a vertex of a sawtooth waveform is rounded, and a drive voltage with a waveform in which a straight line region of a sawtooth waveform is curved.

The following describes advantageous effects of the movable device 13.

Figure 19A:
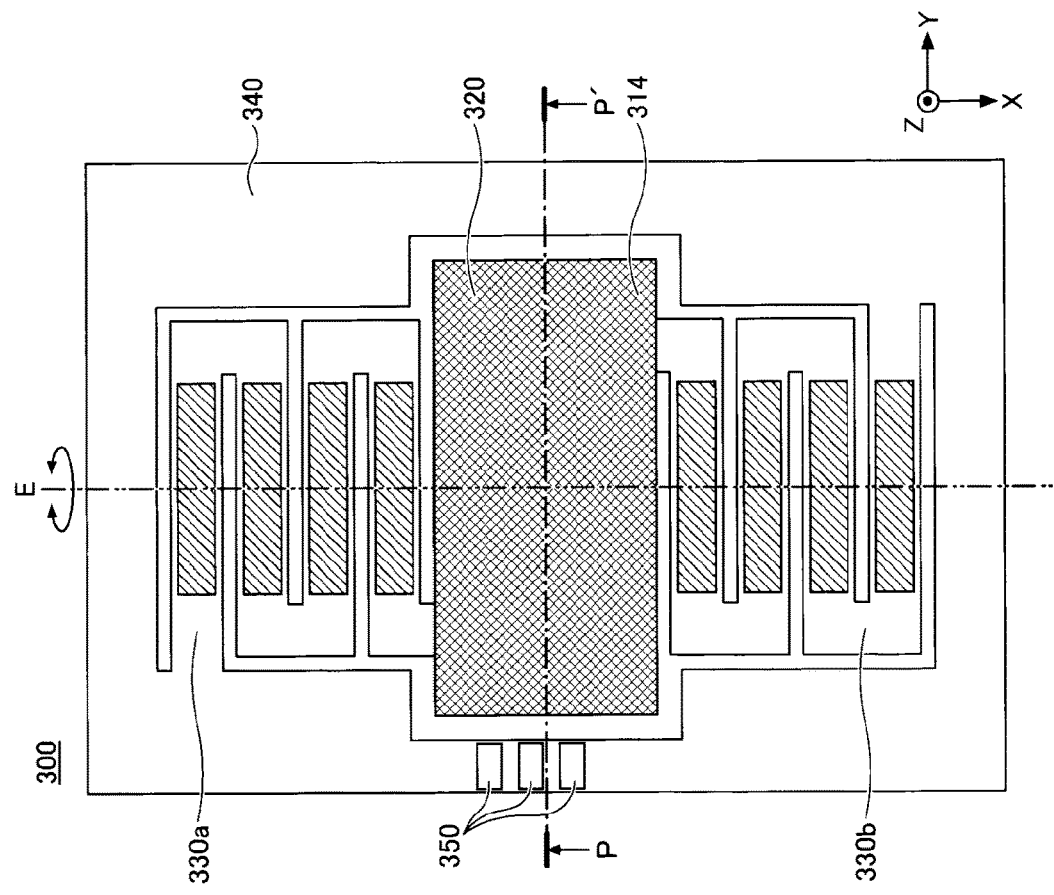
FIG. 19A is a plan view of a configuration of a movable device according to a comparative example.
Figure 19B:
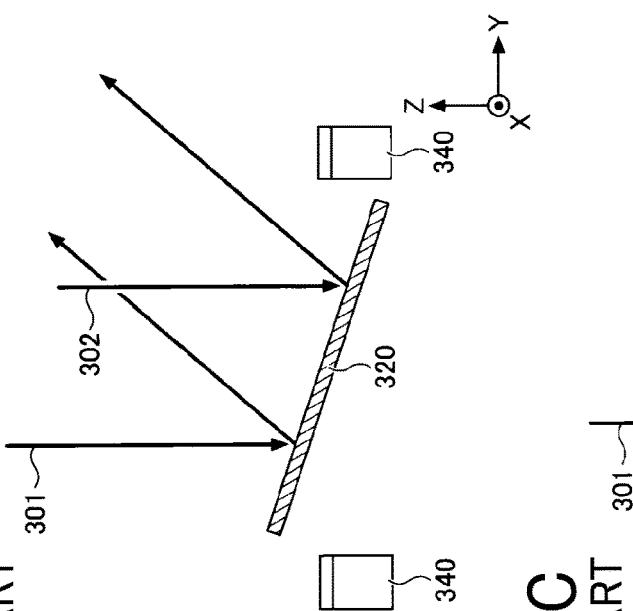
FIG. 19B is a cross-sectional view of the movable device taken along line P-P' in FIG. 19A when an angle of oscillation of a reflecting part is small.
Figure 19C:
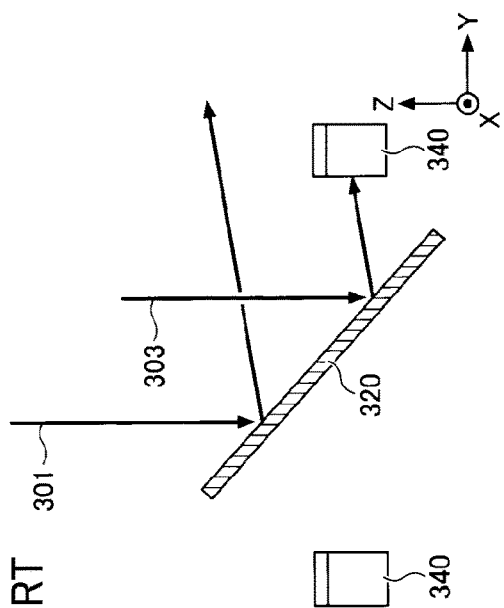
FIG. 19C is a cross-sectional view of the movable device taken along line P-P' in FIG. 19A when the angle of oscillation of the reflecting part is large.

FIG. 19A is a plan view of a configuration of a movable device 300 according to a comparative example. FIG. 19B is a cross-sectional view of the movable device 300 taken along line P-P' in FIG. 19A when an angle of oscillation of a reflecting part is small. FIG. 19C is a cross-sectional view of the movable device 300 taken along line P-P' in FIG. 19A when the angle of oscillation of the reflecting part is large.

As illustrated in FIG. 19A, the movable device 300 includes a reflector 320 having a reflecting surface 314 that reflects incident light, and drive beams 330a and 330b, each of which is connected to the reflector 320 and causes the reflector 320 to oscillate around the E-axis, and a supporting part 340 that supports each of the drive beams 330a and 330b.

In addition, an electrode connecting part 350 is provided on the surface of the supporting part 340 on the −Y-side of the reflector 320. A drive voltage is input to the electrode connecting part 350 and applied to the drive beams 330a and 330b through the wires on the supporting part 340.

FIG. 19B is an illustration of light 301 that has been incident on the reflector 320 in the −Z direction and reflected by the reflector 320. In the example of FIG. 19B, the deflection angle of the reflector 320 is small, and the light (reflected light) 302 reflected by the reflector 320 is not blocked by the supporting part 340 at the +Y side of the reflector 320.

Similarly, FIG. 19C is an illustration of light 301 that has been incident on the reflector 320 in the −Z direction and reflected by the reflector 320. In the example of FIG. 19C, the deflection angle of the reflector 320 is large, and the light (reflected light) 303 reflected by the reflector 320 is blocked by the supporting part 340 at the +Y side of the reflector 320.

As described above, the light 303 reflected by the reflector 320 of the movable device 300 might be blocked by the supporting part 340 at ±Y side of the reflector 320 when the deflection angle of the reflector is large. If the reflected light is blocked, the scanning angle of light being deflected by the reflector 320 is limited, and a large scanning angle cannot be obtained.

By contrast, in the embodiment, the light passing areas 16 and 17 are provided at the sides (±Y sides) of the reflector 120 along the Y direction (see FIG. 15). Further, as the reflector 120 of the movable device 13 is not provided with any element that blocks light reflected by the reflector 120, at each side of the reflector 120 along the Y direction, the reflected light is not blocked even if the deflection angle of the reflector 120 becomes large. This configuration enables a larger scanning angle to be obtained without limiting the scanning angle (deflection angle) of the reflector 120.

In the movable device 13, however, there is no space to provide the electrode connecting part 150 at ±Y side of the reflector 120 in the supporting part because of the presence of the light passing areas 16 and 17. If the electrode connecting part 150 is provided at each of the supporting parts 140a and 140b to apply a drive voltage to each of the piezoelectric drive circuits 131a to 131d and 132a to 132d, the size of the structure for electrically connecting the movable device 13 and the control device 11 might increase. Such an arrangement of the electrode connecting part 150 at each of the supporting parts 140a and 140b might also reduce the degree of flexibility in layout of the components in the movable device 13, which further complicates the configuration of the movable device 13 and increases the manufacturing cost.

In the movable device 13 according to the embodiment, the electrode connecting part 150 is provided at the supporting part 140b to input voltage to at least the piezoelectric drive circuits 131a to 131d, and the piezoelectric drive circuits 131a to 131d are connected by the wires 123 to the electrode connecting part 150 via the reflector 120.

This configuration enables a drive voltage to be applied to each of the piezoelectric drive circuits 131a to 131d and 132a to 132d without providing the electrode connecting part 150 at each of the supporting parts 140a and 140b. Such an absence of the electrode connecting part 150 at each of the supporting parts 140a and 140b prevents upsizing of the structure that electrically connects the movable device 13 and the control device 11. This further improves the degree of flexibility in layout of the components in the movable device 13, and simplifies the structure of the movable device 13, thus preventing an increase in manufacturing cost.

Figure 20:
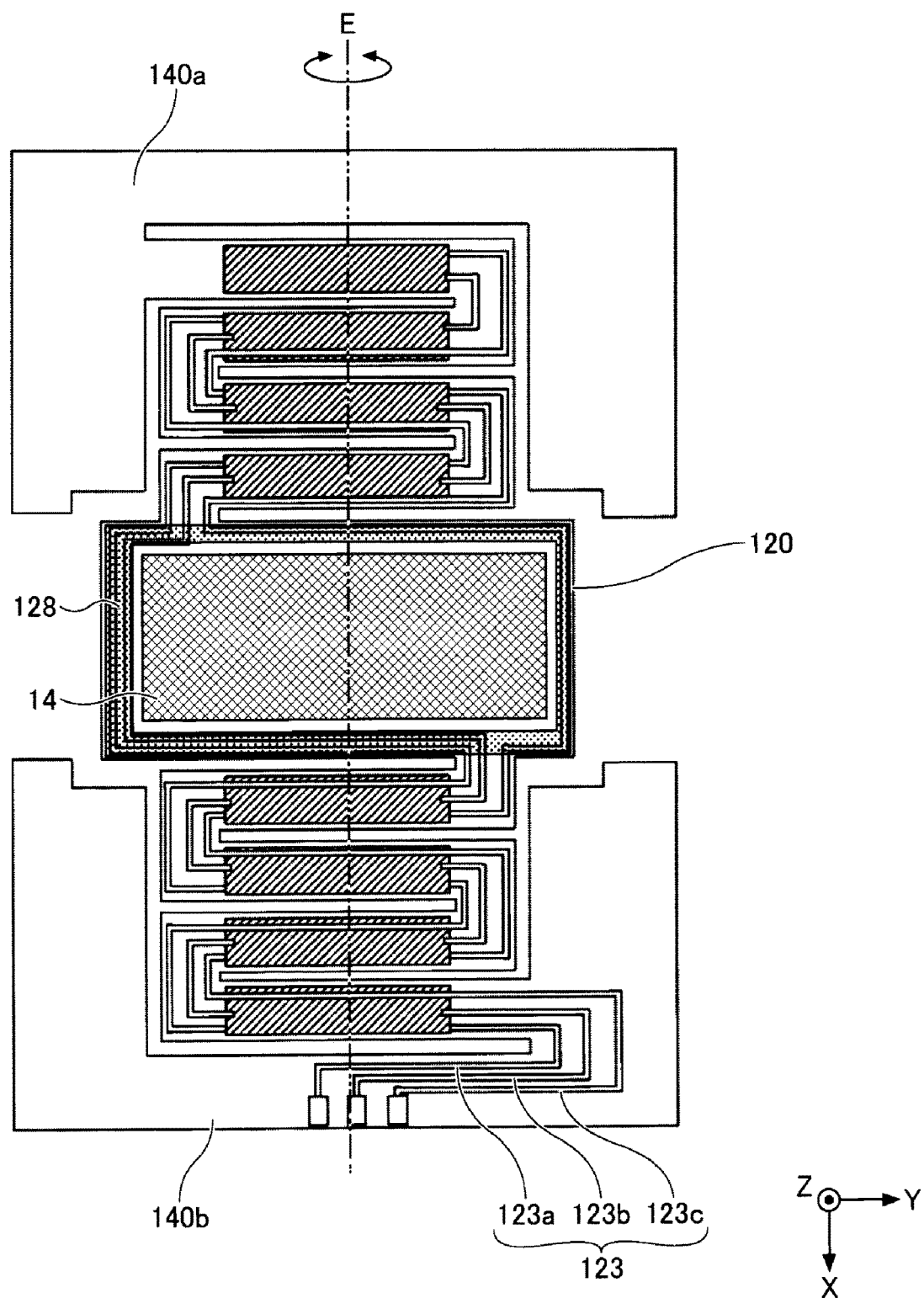
FIG. 20 is a plan view of a configuration of a movable device according to a second embodiment of the present disclosure.

Next, a movable device 13a according to a second embodiment is described. FIG. 20 is a plan view of the configuration of the movable device 13a.

As illustrated in FIG. 20, a light absorber 128 is provided over the wire 123 so as to cover the +Z side of the wires 123 on the reflector 120 along the periphery of the reflector 120 in the movable device 13a.

The light absorber 128 includes material capable of absorbing light deflected by the movable device 13. The material is not particularly limited as long as it can absorb the polarized light. The light absorber 128 is formed, for example, by applying black resin material to the +Z side of the wires 123 or by evaporating black metal material onto the +Z side of the wires 123.

The wires 123 are preferably disposed at an area where light to be incident on the reflecting surface 14 does not reach, on the surface of the reflector 120. However, the light to be incident on the reflecting surface 14 might reach the area in which the wires 123 are disposed due to constraints of an optical design and an error in assembly.

As the wires 123 are formed to have a projection and depression structure with about 1 micrometer (μm), light that is reflected by the wires 123 might propagate in a direction different from a direction in which the light reflected by the reflecting surface 14 propagates, and become noise light.

In the present embodiment, the light absorber 128, which is provided over the wires 123, absorbs light that has reached the area in which the wires are disposed and prevents reflection of the light. Thus, occurrence of noise light is prevented.

Figure 21:
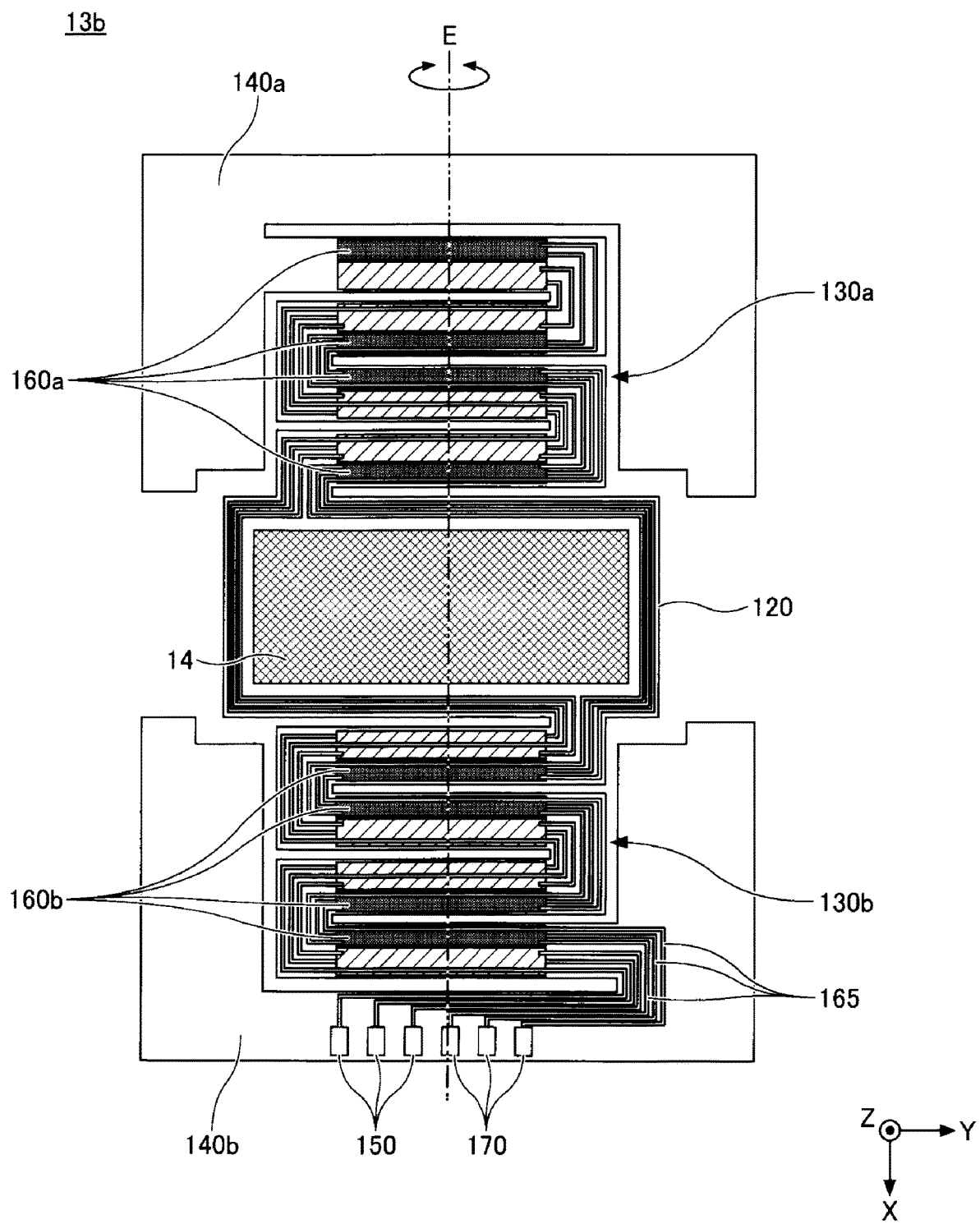
FIG. 21 is a plan view of a configuration of a movable device according to a third embodiment of the present disclosure.

Next, a movable device 13b according to a third embodiment is described. FIG. 21 is a plan view of a configuration of the movable device 13b.

In the movable device 13b as illustrated in FIG. 21, a sensor 160a is disposed adjacent to each of piezoelectric drive circuits 131a to 131d on the surfaces of the beams 130-ab of the drive beam 130a. In addition, a sensor 160b is disposed adjacent to each of piezoelectric drive circuits 132a to 132d on the surfaces of the beams 130-ab of the drive beam 130b.

Further, the supporting part 140b includes an electrode connecting part 170, and wires 165 are provided to electrically connect the sensors 160a and 160b and the electrode connecting part 170.

More specifically, the wires 165 are provided on the surfaces of the supporting part 140b and each beam 130-ab of the drive beam 130b so as to electrically connect the electrode connecting part 170 and the sensor 160b. In addition, the wires 165 are provided on the surface of the reflector 120 along the periphery of the reflector 120 so as to electrically connect the sensor 160a and the sensor 160b via the reflector 120 (with the reflector 120 between the sensors 160a and 160b). The wires 165 are also provided on each beam 130-ab of the drive beams 130a.

The wires 165 includes a positive voltage conducting wire 165a through which a positive voltage signal is transmitted, a GND conducting wire 165b connected to the GND, and a negative voltage conducting wire 165c through which a negative voltage signal is transmitted. The positive voltage conducting wire 165a is connected to the positive electrode connecting part 150a. The GND conducting wire 165b is connected to the GND connecting part 150b. The negative voltage conducting wire 165c is connected to the negative electrode connection part 150c.

Similarly to the piezoelectric drive circuits 131a to 131d and 132a to 132d, the sensors 160a and 160b each includes an upper electrode and a lower electrode made of gold (Au) or platinum (Pt), and a piezoelectric circuit made of a piezoelectric material such as PZT.

When the drive beams 130a and 130b are deformed by applying the drive voltage to the piezoelectric drive circuits 131a to 131d and 132a to 132d, a force due to the deformation is applied to the sensors 160a and 160b on the drive beams 130a and 130b, and the piezoelectric circuits of the sensors 160a and 160b generate voltage due to the piezoelectric effect.

The generated voltage is transmitted through the wires 165 and is output to the control device 11 through the electrode connecting part 170. The control device 11 obtains the deflection angle of the reflector 120 being caused by the drive beam 130 (the drive beams 130a and 130b) to oscillate, according to the received voltage and performs feedback control on the oscillation of the reflector 120, using the obtained deflection angle.

The wires 165 are an example of a wire connecting the second piezoelectric element and the voltage input part. The sensor 160a is an example of a third piezoelectric element, and the electrode connecting part 170 is an example of a voltage output part.

If a failure due to disconnection of the wires 165 occurs in the movable device 13b, the movable device 13b outputs an abnormal voltage value to the control device 11 or fails to output any voltage value to the control device 11 because to the disconnection of the wires 165. The control device 11 detects the failure of the movable device 13b in accordance with such an abnormal value or information that any voltage value is not output from the movable device 13b.

In the present embodiment as described above, the sensors 160a and 160b are provided at each of the beams 130-ab of the drive beams 130a and 130b. The control device 11 obtains the deflection angle of the reflector 120 based on the voltage generated due to the deformation of the drive beams 130a and 130b, and performs feedback control on the oscillation of the reflector 120 using the obtained deflection angle of the reflector 120. This enables the deflection angle of the reflector 120 to be monitored and controlled in real time and provides a stable operation of the reflector 120.

In the present embodiment, the deflection angle of the reflector 120 is obtained using the piezoelectric effects is described. However, no limitation is intended thereby. In some examples, a method in which the reflecting surface 14 is irradiated with a laser beam for detecting an angle, and the laser beam reflected from the reflecting surface 14 is used to obtain an deflection angle of the reflector 120 is also applicable.

In some other embodiments, the light absorber 128 described in the second embodiment may be provided over the wire 165, so as to cover the +Z side of the wires 165 arranged along the periphery of the reflector 120 may be provided. This prevents the occurrence of noise light due to the light reflected by the wires 165, which is the same advantageous effect as those of the second embodiment.

Figure 22:
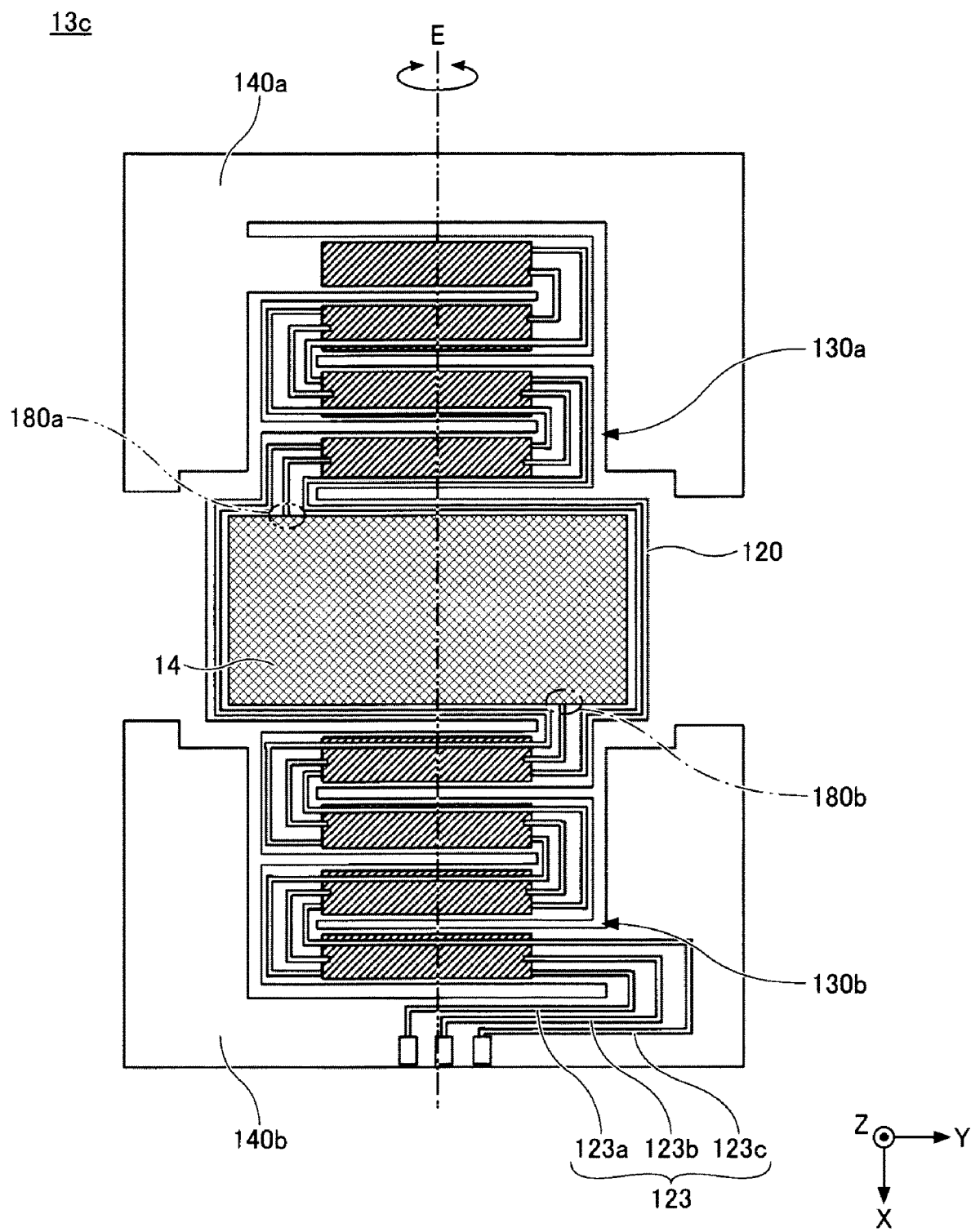
FIG. 22 is a plan view of a configuration of a movable device according to a fourth embodiment of the present disclosure.

A movable device 13c according to a fourth embodiment is described. FIG. 22 is a plan view of a configuration of the movable device 13c.

The movable device 13c is configured such that the GND conducting wire 123b of the wires 123 is connected to the reflecting surface 14. In FIG. 22, a circle portion 180b indicated by a dot-and-dash line denotes a portion where the GND conducting wire 123b on the drive beam 130b is connected to the reflecting surface 14. Further, a circle portion 180a indicated by a chain double-dashed line denotes a portion where the GND conducting wire 123b on the drive beam 130a is connected to the reflecting surface 14.

The reflecting surface 14 is a thin metal film that is a conductor made of, for example, aluminum (Al), gold (Au), and silver (Ag), and transmits a voltage signal, which is transmitted through the GND conducting wire 123b, therethrough.

This configuration enables the GND conducting wire 123b on the drive beam 130a and the GND conducting wire 123b on the drive beam 130b to to be electrically connected to each other electrically through the reflecting surface 14.

Such a connection arrangement in which a voltage signal is transmitted through the reflecting surface 14 eliminates the need for providing the GND conducting wire 123b along the periphery of the reflector 120, and enables a reduction in the area of the reflector 120 accordingly.

Such a reduction in the area of the reflector 120 further reduces the moment of inertia of the reflector 120, which enables an increase in the resonance frequency of the movable device 13. The increase in the resonance frequency enables, for example, a high-speed scanning with light reflected by the reflecting surface 14.

In the present embodiment, the GND conducting wire 123b on the drive beam 130a and the GND conducting wire 123b on the drive beam 130b are connected to each other electrically through the reflecting surface 14. However, no limitation is intended thereby. Either one of the positive voltage conducting wire 123a and the negative voltage conducting wire 123c may be connected electrically through the reflecting surface 14. In other words, any one of plurality of conducting wires of the wires 123 on the drive beams 130a and 130b may be connected through the reflecting surface 14.

The configuration in which the GND conducting wire 123b on the drive beam 130a and the GND conducting wire 123b on the drive beam 130b are connected to each other electrically through the reflecting surface 14 particularly enables the active layers of the reflector 120 and the drive beam 130 (the drive beams 130a and 130b) to be electrically grounded. This advantageously reduces noise superimposed on the voltage signal.

The configuration of the drive beams 130a and 130b of the movable device according to at least one embodiment is not limited to the configuration in which a plurality of beams 130-ab is joined as described in the first to fourth embodiments, and various modifications are possible. The following describes a movable device provided with one beam 130-ab, according to a modification of an embodiment.

Figure 23:
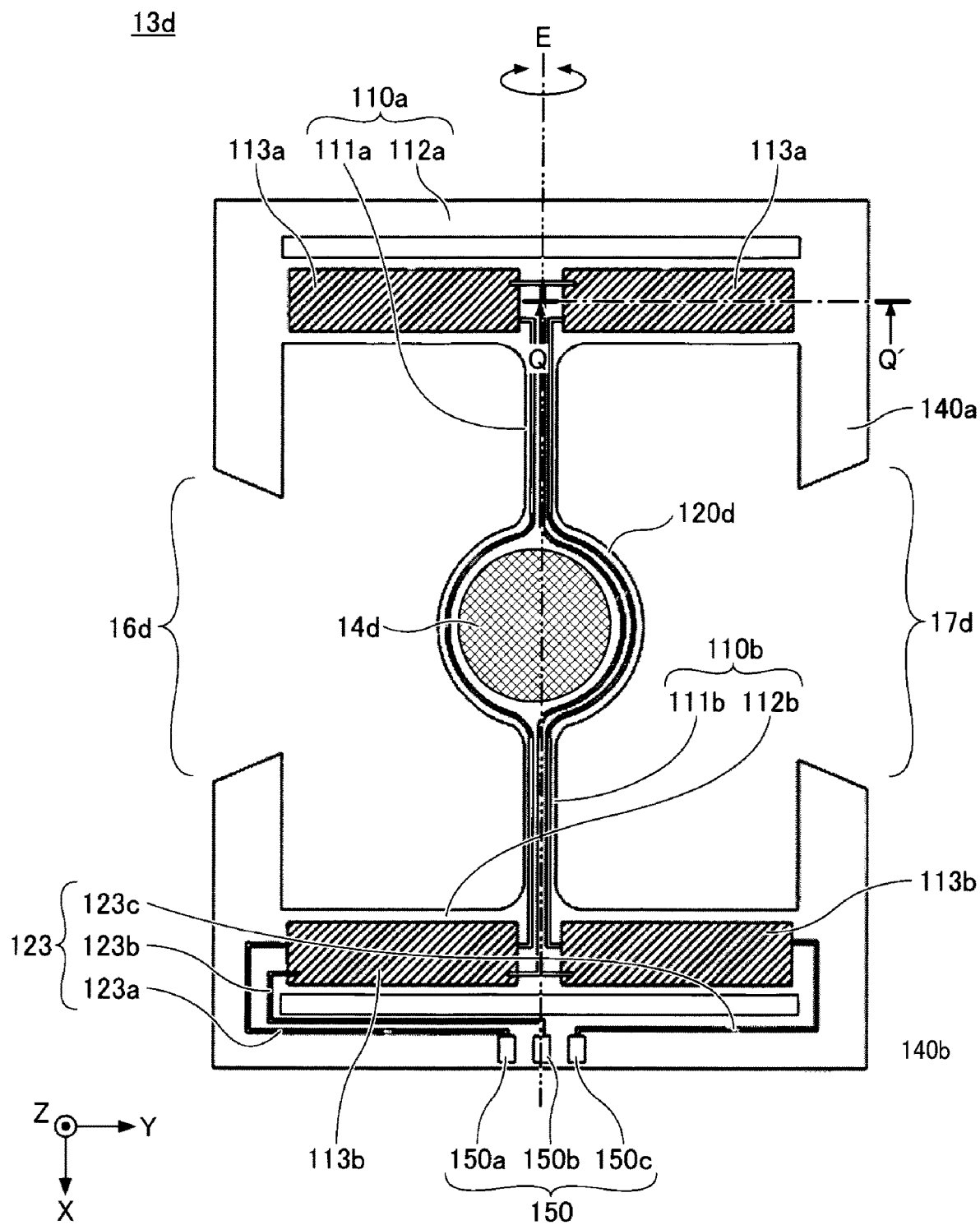
FIG. 23 is a plan view of a configuration of a movable device according to a first modification of an embodiment of the present disclosure.
Figure 24:
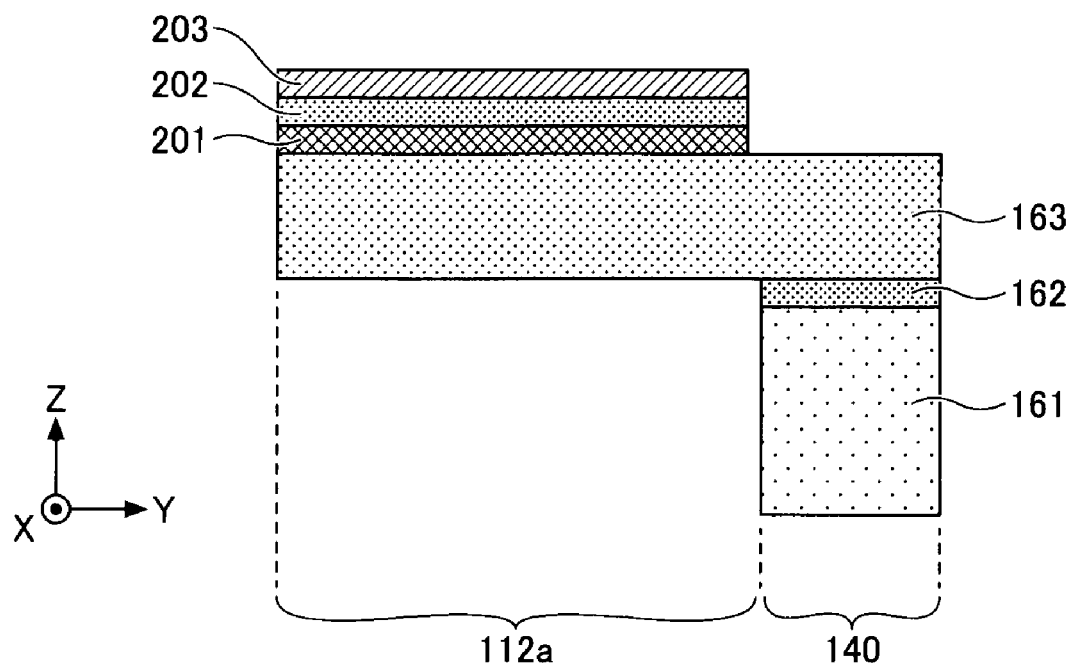
FIG. 24 is a cross-sectional view of the movable device taken along line Q-Q' in FIG. 23.

A movable device 13d according to a first modification of an embodiment, with reference to FIGS. 23 and 24. FIG. 23 is a plan view of a configuration of the movable device 13d. FIG. 24 is a cross-sectional view of the movable device 13d taken along line Q-Q' in FIG. 23.

The movable device 13d includes a reflector 120d and drive beams 110a and 110b. The reflector 120d includes a base body that includes, for example, a silicon active layer, and a reflecting surface 14d on the surface of the base body.

The reflecting surface 14d is a thin metal film containing, for example, aluminum, gold, and silver. The reflector 120d may have a reinforcing rib on the −Z-side surface of the base body for the reflecting surface 14d. The reinforcing rib is formed of, for example, a silicon support layer and a silicon oxide layer, and prevent distortion of the reflecting surface 14d caused the oscillation of the reflector 120d. The reflecting surface 14d has a circular shape, but the reflecting surface 14d may have another shape, such as an ellipse or a rectangle.

The drive beam 110a includes a torsion bar 111a and a beam 112a. The torsion bar 111a has one end coupled to the beam 112a and the other end coupled to the reflector 120d. Both ends of the beam 112a are coupled to the inner peripheral portion of the supporting part 140a, and are supported by the supporting part 140a. The beam 112a includes piezoelectric drive circuits 113a.

The drive beam 110b includes a torsion bar 111b and a beam 112b. The torsion bar 111b has one end coupled to the beam 112b and the other end coupled to the reflector 120d. Both ends of the beam 112b are coupled to the inner peripheral portion of the supporting part 140b, and are supported by the supporting part 140b. The beam 112b includes piezoelectric drive circuits 113b.

The torsion bars 111a and 111b each includes a silicon active layer. The piezoelectric drive circuits 113a and 113b each includes a lower electrode 201, a piezoelectric circuit 202, and an upper electrode 203 that are formed in that order on the surface of a silicon active layer 163 that serves as an elastic member (see FIG. 24).

The upper electrode 203 and the lower electrode 201 includes gold (Au) or platinum (Pt). The piezoelectric circuit 202 includes, for example, PZT as piezoelectric material.

Although this modification has illustrated an example in which the piezoelectric circuit 202 is formed on a surface (+Z-side surface) of the silicon active layer 163 serving as the elastic member, the piezoelectric circuit 202 may be formed on another surface (for example, −Z-side surface) of the elastic member, or on both the surface and the other surface of the elastic member.

The shapes of the components are not limited to the shapes in the embodiment as long as the reflector 120d is rotatable around the E-axis. For example, the torsion bars 111a and 111b and the piezoelectric drive circuits 113a and 113b may have a shape with curvature.

As illustrated in FIG. 15, an electrode connecting part 150 for receiving a voltage signal from the control device 11 is provided on the surface of the supporting part 140b. The electrode connecting part 150 includes a positive electrode connecting part 150a to which a positive voltage is applied, a GND connecting part 150b connected to the GND, and a negative electrode connecting part 150c to which a negative voltage is applied.

Wires 123 are provided on an area other than the reflecting surface 14d on the surface of the reflector 120d and also on the surface of the drive beams 110a and 110b. The wires 123 transmit voltage signals input through the electrode connecting part 150. The wires 123 transmit voltage signals input through the electrode connecting part 150 to both the drive beam 110b and the drive beam 110a through the reflector 120d.

In other words, the piezoelectric drive circuit 113a of the drive beam 110a is electrically connected by the wires 123 to the electrode connecting part 150 on the supporting part 140b via the reflector 120d. Such an arrangement of the wires 123 enables drive voltage input through the electrode connecting part 150 to be applied to both the drive beams 110a and 110b.

More specifically, the wires 123 are provided on the surface of the supporting part 140b so as to electrically connect the electrode connecting part 150 and the piezoelectric drive circuit 113b. Further, the wires 123 are provided on the surfaces of the beam 112b, the torsion bar 111b, the reflector 120d, the torsion bar 111a, and the beam 112a, so as to electrically connect the piezoelectric drive circuits 113b and 113a through the reflector 120d. In this case, the wires are provided along the periphery of the reflector 120d.

The wires 123 includes a positive voltage conducting wire 123a through which a positive voltage signal is transmitted, a GND conducting wire 123b connected to the GND, and a negative voltage conducting wire 123c through which a negative voltage signal is transmitted. The positive voltage conducting wire 123a is connected to the positive electrode connecting part 150a. The GND conducting wire 123b is connected to the GND connecting part 150b. The negative voltage conducting wire 123c is connected to the negative electrode connection part 150c.

The GND conducting wire 123b is connected to the upper electrodes of each of the piezoelectric driving circuits 113a and 113b. Moreover, the positive voltage conducting wire 123a is coupled to the lower electrode of each of the piezoelectric drive circuits 113a and 113b, transmits a positive voltage signal thereto, and applies a positive drive voltage thereto. Moreover, the negative voltage conducting wire 123c is coupled to the lower electrode 201 of each of the piezoelectric drive circuits 113a and 113b, transmits a negative voltage signal thereto, and applies a negative drive voltage thereto.

The drive beam 110b is an example of a first movable unit, and the drive beam 110a is an example of a second movable unit. The piezoelectric drive circuit 113b is an example of a first piezoelectric element, and the piezoelectric drive circuit 113a is an example of a second piezoelectric element.

An opening area where the supporting part 140 does not exist is provided at each side of the reflector 120d in the Y direction. Such an opening area defines light passing areas 16d and 17d. The light passing areas 16d and 17d enables light reflected by the reflecting surface 14 to be transmitted therethrough when the reflector 120d oscillates. The light passing areas 16d and 17d each has a tapered shape in which the width parallel with the E axis increases with an increase in the distance from the E-axis. However, the shapes of the light passing areas 16d and 17d are not limited to the tapered shape.

In this way, the wires 123 transmit voltage signals input through the electrode connecting part 150, and thus apply drive voltage to the piezoelectric drive circuits 113a and 113b. Alternatively, the wires 123 may transmit a current signal instead of the voltage signal.

The motion and so forth of the drive beam 110 by application of a drive voltage is similar to that of the drive beams 130a and 130b according to the first embodiment. The advantageous effects of the movable device 13d are similar to those of the movable device 13 according to the first embodiment, and redundant description is omitted.

Figure 25:
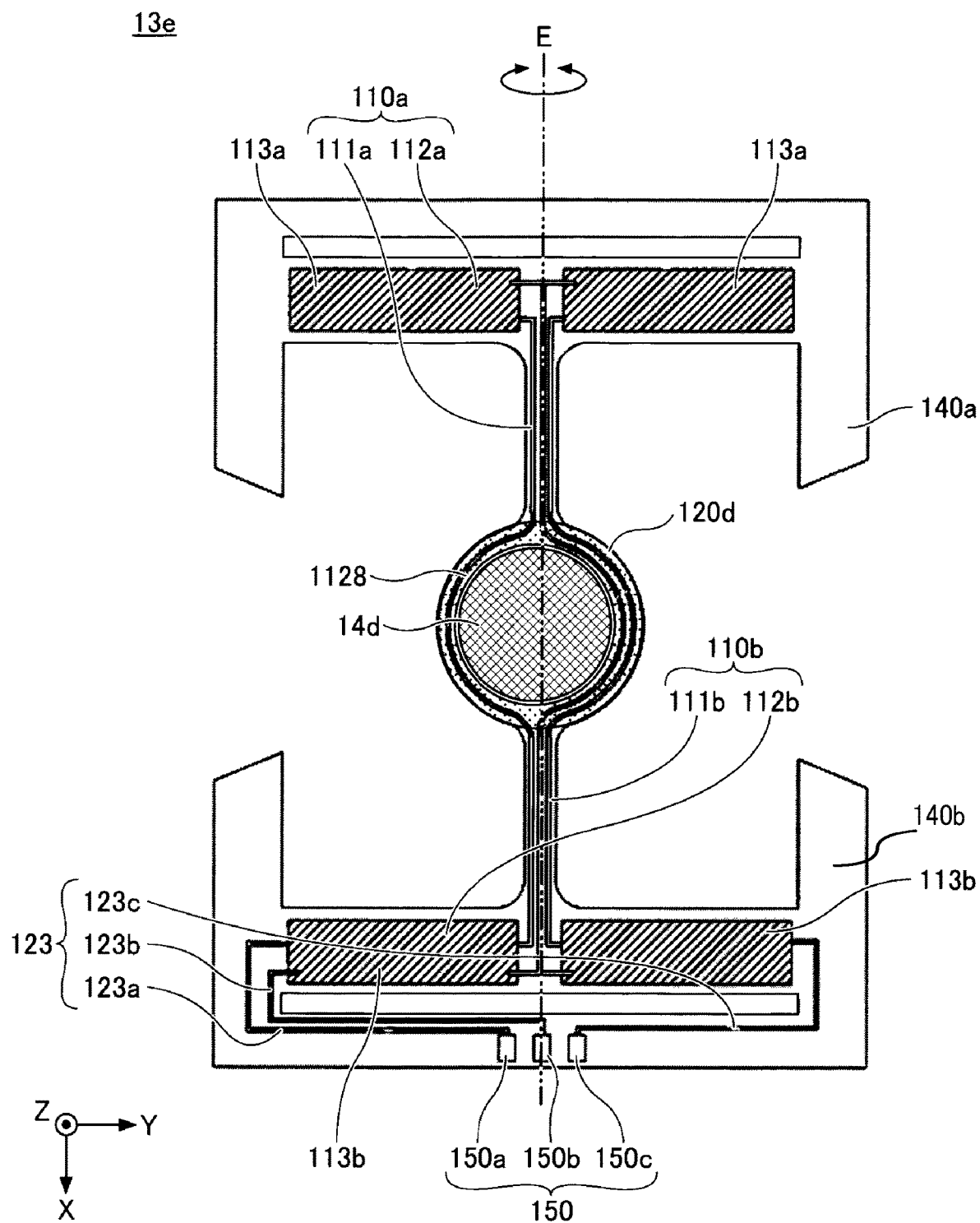
FIG. 25 is a plan view of a configuration of a movable device according to a second modification of an embodiment of the present disclosure.

FIG. 25 is a plan view of a configuration of a movable device 13e according to a second modification of an embodiment. As illustrated in FIG. 25, a light absorber 128 is provided to cover the wires 123 on the +Z side surface of the reflector 120d along the periphery of the reflector 120d in the movable device 13e. The configuration and the advantageous effect of the light absorber 128 are the same as those of the light absorber 128 according to the second embodiment, and redundant description is omitted.

Figure 26:
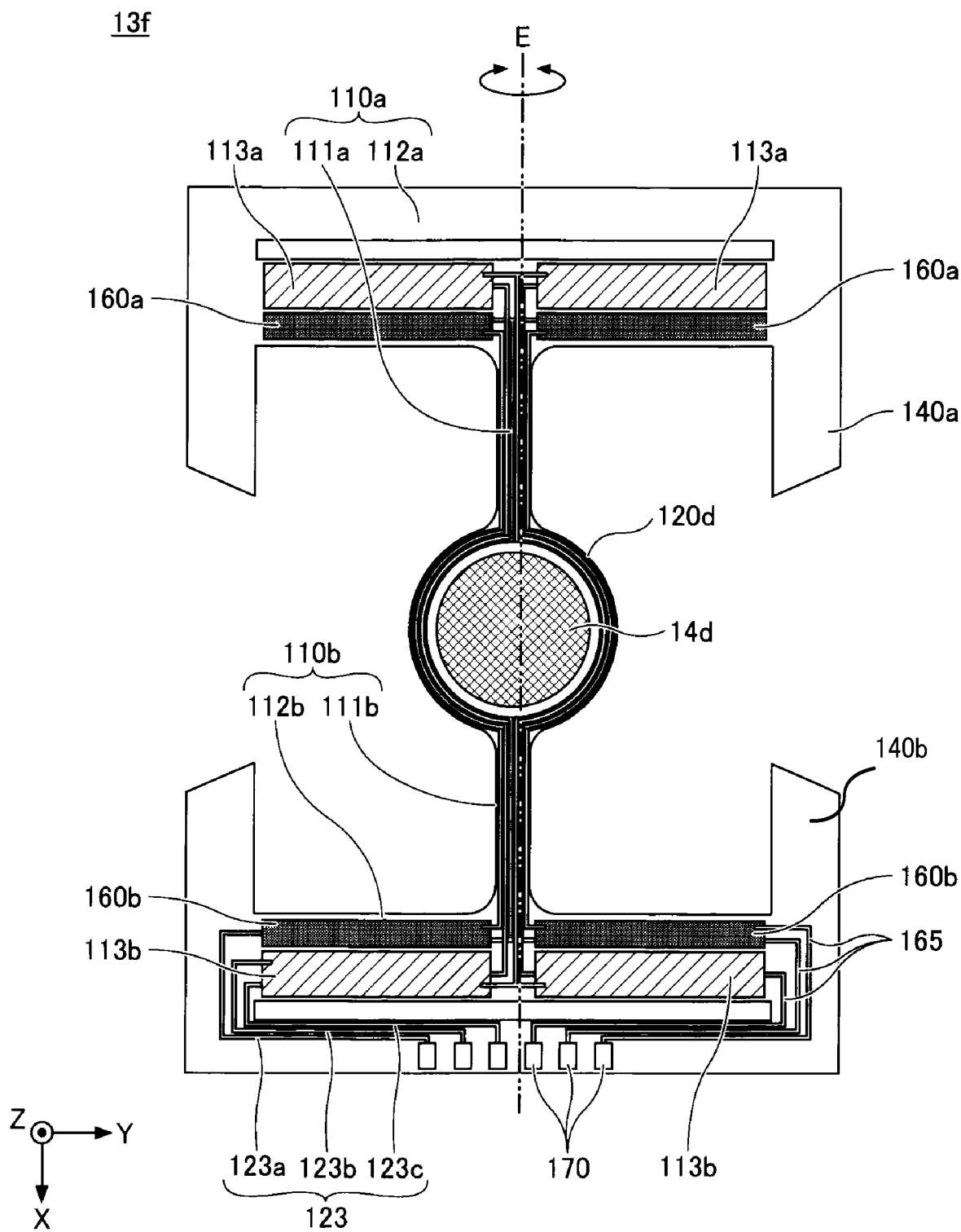
FIG. 26 is a plan view of a configuration of a movable device according to a third modification of an embodiment of the present disclosure.

FIG. 26 is a plan view of a configuration of a movable device 13f according to a third modification of an embodiment.

In the movable device 13f as illustrated in FIG. 26, a sensor 160a is disposed adjacent to the piezoelectric drive circuit 113a on the surface of the beam 112a of the drive beam 110a. In addition, a sensor 160b is disposed adjacent to the piezoelectric drive circuit 113b on the surface of the beam 112b of the drive beam 130b.

Further, the supporting part 140b includes an electrode connecting part 170, and wires 165 are provided to electrically connect the sensors 160a and 160b and the electrode connecting part 170.

More specifically, the wires 165 are provided on the supporting part 140b so as to electrically connect the electrode connecting part 170 and the sensor 160b. Further, the wires 165 are provided on the surfaces of the beam 112b, the torsion bar 111b, the reflector 120d, the torsion bar 111a, and the beam 112a, so as to electrically connect the sensor 160a and the sensor 160b through the reflector 120d. In this case, the wires are provided along the periphery of the reflector 120d.

The configurations and advantageous effects of the sensors 160a and 160b and the wires 165 are the same as those according to the third embodiment, and redundant description is omitted.

Figure 27:
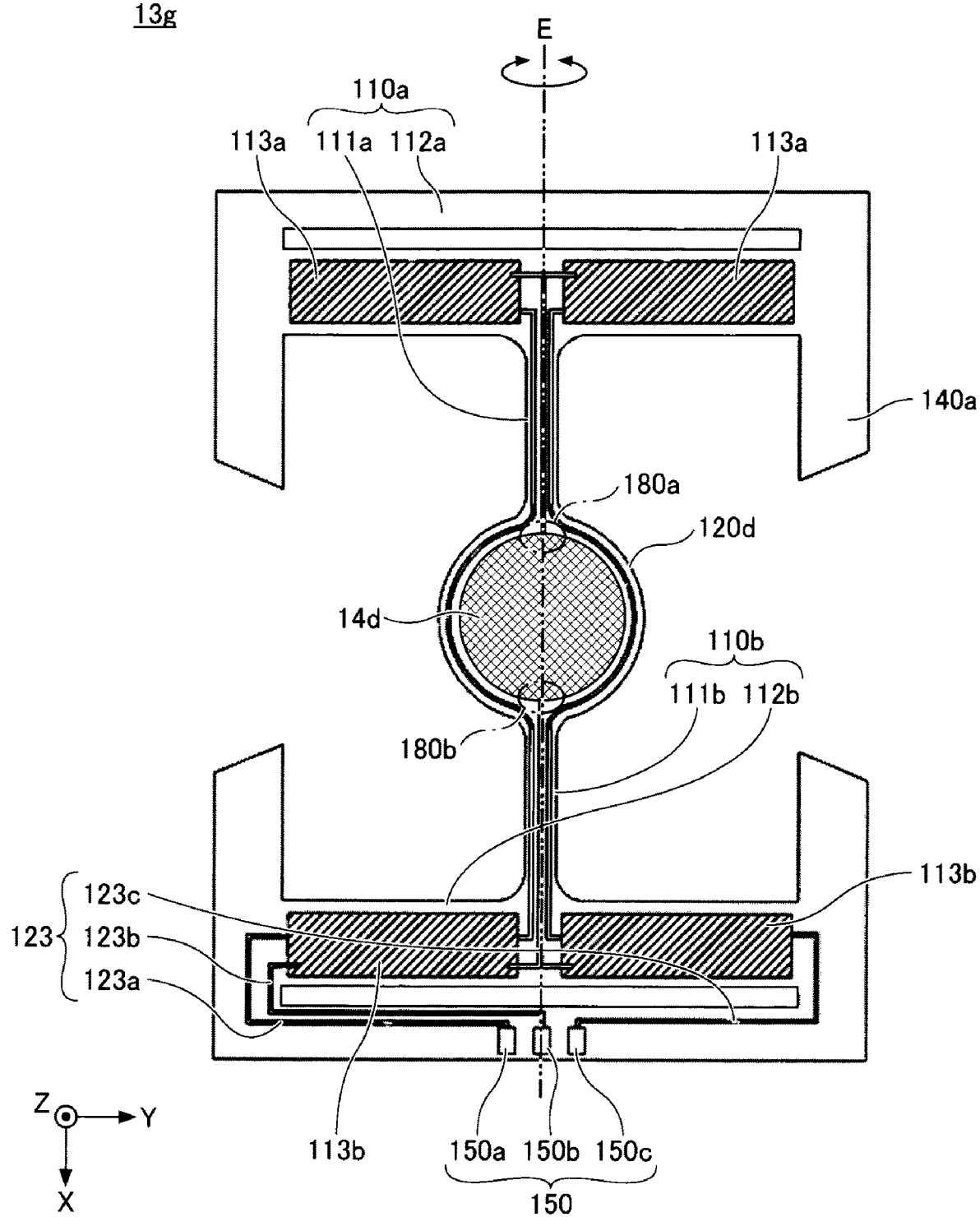
FIG. 27 is a plan view of a configuration of a movable device according to a fourth modification of an embodiment of the present disclosure.

FIG. 27 is a plan view of a configuration of a movable device 13g according to a fourth modification of an embodiment.

The movable device 13g is configured such that the GND conducting wire 123b of the wires 123 is connected to the reflecting surface 14d. In FIG. 27, a circle portion 180b indicated by a dot-and-dash line denotes a portion where the GND conducting wire 123b on the torsion bar 111b is connected to the reflecting surface 14d. Further, a circle portion 180a indicated by a chain double-dashed line denotes a portion where the GND conducting wire 123b on the torsion bar 111a is connected to the reflecting surface 14d.

The reflecting surface 14d is a thin metal film that is a conductor made of, for example, Al, Au, and Ag, and transmits a voltage signal, which is transmitted through the GND conducting wire 123b, therethrough.

This configuration enables the GND conducting wire 123b on the torsion bar 111a and the GND conducting wire 123b on the torsion bar 111b to be connected to each other electrically through the reflecting surface 14d.

The advantageous effects of the movable device 13g are similar to those of the movable device 13c according to the fourth embodiment, and redundant description is omitted.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:
1. A light deflector, comprising:
a reflector having a reflecting surface;
a first movable unit coupled to the reflector;
a second movable unit coupled to the reflector, the reflector disposed between the first movable unit and the second movable unit;

a first piezoelectric element disposed on the first movable unit, the first piezoelectric element configured to deform the first movable unit;

a second piezoelectric element disposed on the second movable unit, the second piezoelectric element configured to deform the second movable unit;

a first supporting part coupled to the first movable unit;

a second supporting part coupled to the second movable unit;

an input part disposed on the first supporting part, the input part configured to receive a voltage to be applied to at least the second piezoelectric element; and a wire electrically connecting the second piezoelectric element and the input part through the reflector, the wire configured to transmit the voltage received by the input part, to the second piezoelectric element, wherein the reflector is between the first movable unit and the second movable unit along a first axis, a passage area is provided through which light reflected by the reflector passes, the passage area extends along the first axis between the first supporting part and the second supporting part, the passage area is disposed on each side of the reflector in a direction intersecting the first axis on a same plane as the reflecting surface, and the passage area separates the first supporting part and the second supporting part in the direction intersecting the first axis on the same plane as the reflecting surface, the wire is disposed on the reflector and between the passage area and the reflecting surface, each of the first supporting part and the second supporting part has a first end and a second end disposed along the first axis such that both the first supporting part and the second supporting part extend along the first axis, the first end of the first supporting part faces the first end of the second supporting part across the passage area, and the second end of the first supporting part faces the second end of the second supporting part across the passage area.

2. The light deflector according to claim 1, further comprising a light absorber over the wire on the reflector, the light absorber configured to absorb incident light.

3. The light deflector according to claim 1, wherein
the wire includes a plurality of conducting wires,
one of the plurality of conducting wires is electrically connected to the reflecting surface, and
the reflecting surface is a conductor.

4. The light deflector according to claim 3, wherein the one of the plurality of conducting wires, which is electrically connected to the reflecting surface, is electrically grounded.

5. The light deflector according to claim 1, further comprising:

a third piezoelectric element disposed on the second movable unit;

a voltage output part disposed on the first supporting part, the voltage output part configured to output a voltage received from at least the third piezoelectric element; and another wire electrically connecting the third piezoelectric element and the voltage output part through the reflector.

6. The light deflector according to claim 5, further comprising a light absorber over at least one of the wire on the reflector and said another wire on the reflector, the light absorber configured to absorb incident light.

7. The light deflector according to claim 1, wherein each of the first movable unit and the second movable unit includes a plurality of beams joined to turn.

8. A deflecting device, comprising:
a light source; and
the light deflector according to claim 1.

9. A distance-measuring apparatus comprising the light deflector according to claim 1.

10. A vehicle comprising the distance-measuring apparatus according to claim 9.

11. An image projection device comprising the light deflector according to claim 1.

12. A vehicle comprising the image projection device according to claim 11.

13. The light deflector according to claim 1, wherein the second supporting part does not include the input part.

14. The light deflector according to claim 1, wherein
the first supporting part further includes the input part, and
the input part is configured to receive a voltage applied to the first piezoelectric element.

15. A light deflector, comprising:
a reflector having a reflecting surface;
a first movable unit coupled to the reflector;
a second movable unit coupled to the reflector, the reflector disposed between the first movable unit and the second movable unit;
a first piezoelectric element disposed on the first movable unit, the first piezoelectric element configured to deform the first movable unit;
a second piezoelectric element disposed on the second movable unit, the second piezoelectric element configured to deform the second movable unit;
a first supporting part coupled to the first movable unit;
a second supporting part coupled to the second movable unit;
an input part disposed on the first supporting part, the input part configured to receive a voltage to be applied to at least the second piezoelectric element; and
a wire electrically connecting the second piezoelectric element and the input part through the reflector, the wire configured to transmit the voltage received by the input part, to the second piezoelectric element, wherein
the reflector is disposed between the first movable unit and the second movable unit along a first axis,
a passage area is provided through which light reflected by the reflector passes, and
the passage area extends along the first axis, the passage area is positioned between the first supporting part and the second supporting part, and the passage area does not overlap the first supporting part and the second supporting part,
the passage area is disposed on each side of the reflector in a direction intersecting the first axis on a same plane as the reflecting surface, and
the passage area separates the first supporting part and the second supporting part in the direction intersecting the first axis on the same plane as the reflecting surface, and
the wire is disposed on the reflector and between the passage area and the reflecting surface.

16. The light deflector according to claim 15, further comprising a light absorber over the wire, the light absorber configured to absorb incident light.

17. The light deflector according to claim 15, wherein
the wire includes a plurality of conducting wires,
one of the plurality of conducting wires is electrically connected to the reflecting surface, and
the reflecting surface is a conductor.

18. The light deflector according to claim 17, wherein the one of the plurality of conducting wires, which is electrically connected to the reflecting surface, is electrically grounded.

19. The light deflector according to claim 15, further comprising:
- a third piezoelectric element disposed on the second movable unit;
- a voltage output part disposed on the first supporting part, the voltage output part configured to output a voltage received from at least the third piezoelectric element; and
- another wire electrically connecting the third piezoelectric element and the voltage output part through the reflector.

20. The light deflector according to claim 19, further comprising a light absorber over at least one of the wire on the reflector and said another wire on the reflector, the light absorber configured to absorb incident light.

* * * * *